(12) United States Patent
Li et al.

(10) Patent No.: US 8,773,882 B2
(45) Date of Patent: Jul. 8, 2014

(54) MIXED-SCALE ELECTRONIC INTERFACES

(75) Inventors: Zhiyong Li, Palo Alto, CA (US); Warren Robinett, Chapel Hill, NC (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 375 days.

(21) Appl. No.: 12/761,300

(22) Filed: Apr. 15, 2010

(65) Prior Publication Data

US 2010/0197117 A1   Aug. 5, 2010

Related U.S. Application Data

(62) Division of application No. 11/590,492, filed on Oct. 30, 2006, now Pat. No. 7,741,204.

(51) Int. Cl.
| | |
|---|---|
| *G11C 5/06* | (2006.01) |
| *G11C 5/12* | (2006.01) |
| *B82Y 10/00* | (2011.01) |
| *B82B 1/00* | (2006.01) |
| *B82B 3/00* | (2006.01) |
| *B82Y 40/00* | (2011.01) |

(52) U.S. Cl.
CPC .. *G11C 5/06* (2013.01); *G11C 5/12* (2013.01); *B82Y 10/00* (2013.01); *B82Y 40/00* (2013.01); *B82B 1/00* (2013.01); *B82B 3/00* (2013.01); *G11C 2213/81* (2013.01); *Y10S 977/762* (2013.01); *Y10S 977/94* (2013.01)
USPC ............... 365/63; 365/148; 365/151; 365/72; 977/762; 977/940

(58) Field of Classification Search
CPC ........ G11C 5/06; G11C 5/12; G11C 2213/81; B82Y 10/00; B82Y 40/00; B82B 1/00; B82B 3/00
USPC ......... 365/148, 151, 189.02, 230.02, 231, 63, 365/72; 977/762, 940
See application file for complete search history.

(56) References Cited

U.S. PATENT DOCUMENTS

| | | | |
|---|---|---|---|
| 4,335,161 A | 6/1982 | Luo | |
| 6,256,767 B1* | 7/2001 | Kuekes et al. | ................ 365/151 |
| 6,407,443 B2 | 6/2002 | Chen | |
| 6,999,453 B1* | 2/2006 | Chemla et al. | ................ 370/389 |
| 7,073,157 B2* | 7/2006 | DeHon et al. | .................... 716/30 |
| 7,187,201 B1* | 3/2007 | Trimberger | ..................... 326/41 |
| 7,319,416 B2* | 1/2008 | Robinett et al. | ................ 341/96 |
| 7,416,993 B2 | 8/2008 | Segal | |
| 7,489,583 B2* | 2/2009 | Kuekes et al. | ........... 365/230.02 |
| 7,544,977 B2* | 6/2009 | Snider et al. | .................. 257/208 |

(Continued)

*Primary Examiner* — J. H. Hur

(57) ABSTRACT

Certain embodiments of the present invention are directed to a method of programming nanowire-to-conductive element electrical connections. The method comprises: providing a substrate including a number of conductive elements overlaid with a first layer of nanowires, at least some of the conductive elements electrically coupled to more than one of the nanowires through individual switching junctions, each of the switching junctions configured in either a low-conductance state or a high-conductance state; and switching a portion of the switching junctions from the low-conductance state to the high-conductance state or the high-conductance state to the low-conductance state so that individual nanowires of the first layer of nanowires are electrically coupled to different conductive elements of the number of conductive elements using a different one of the switching junctions configured in the high-conductance state. Other embodiments of the present invention are directed to a nanowire structure including a mixed-scale interface.

10 Claims, 20 Drawing Sheets

(56) References Cited

U.S. PATENT DOCUMENTS

| | | |
|---|---|---|
| 2004/0149978 A1 | 8/2004 | Snider |
| 2004/0181630 A1 | 9/2004 | Jaiprakash |
| 2005/0055387 A1* | 3/2005 | Kuekes et al. .................... 708/1 |
| 2007/0176168 A1* | 8/2007 | Snider et al. .................... 257/40 |

* cited by examiner

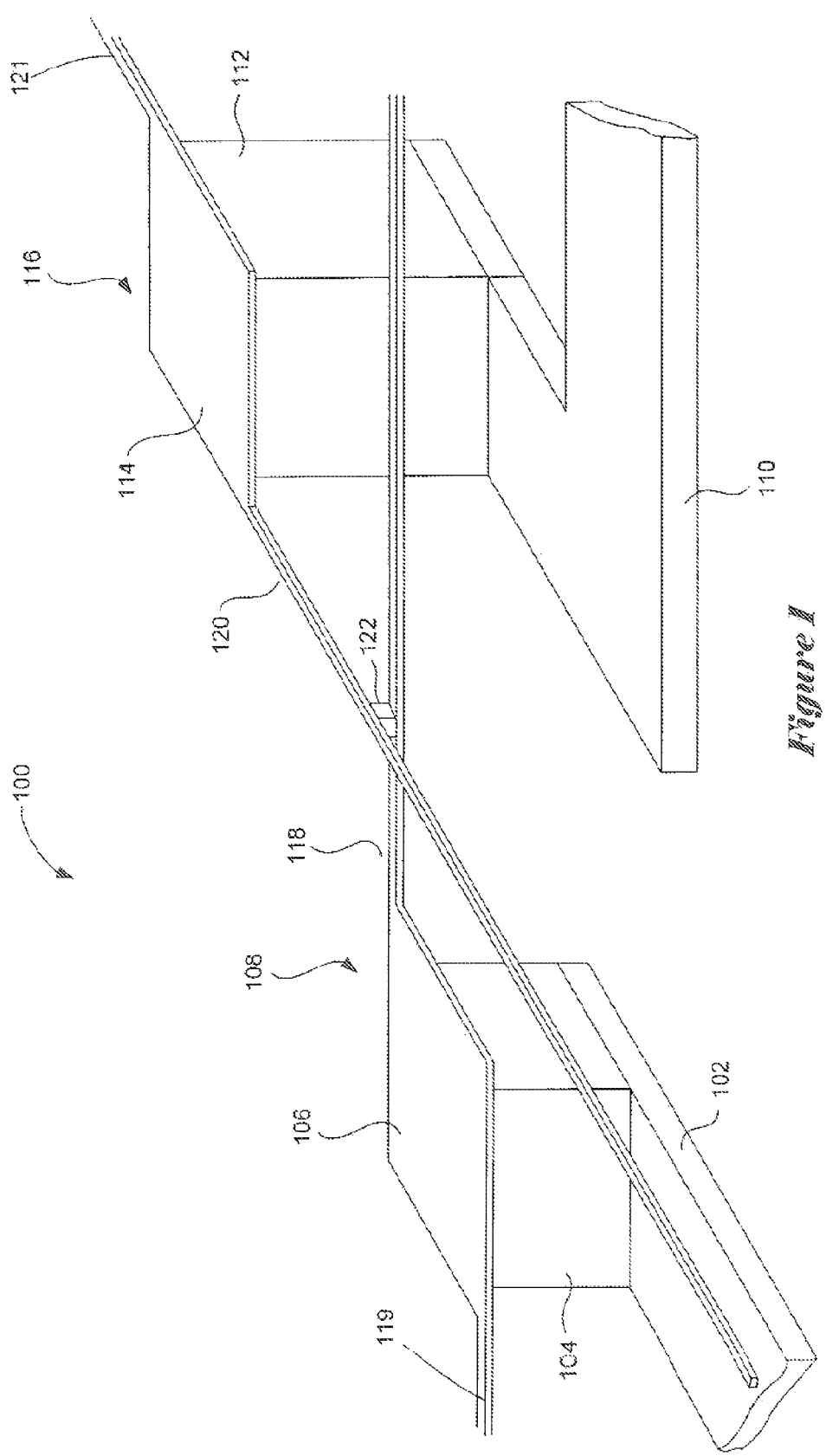

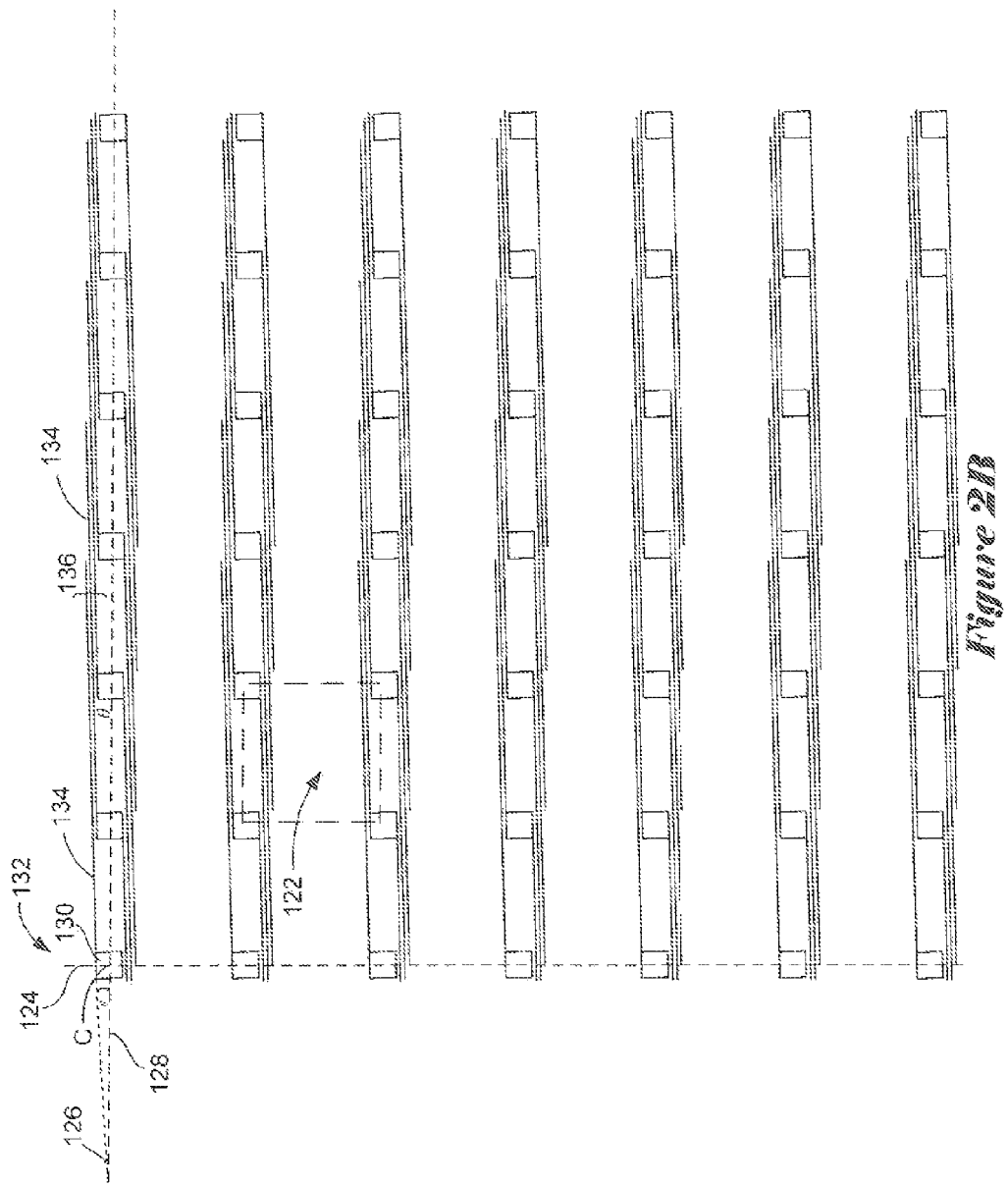

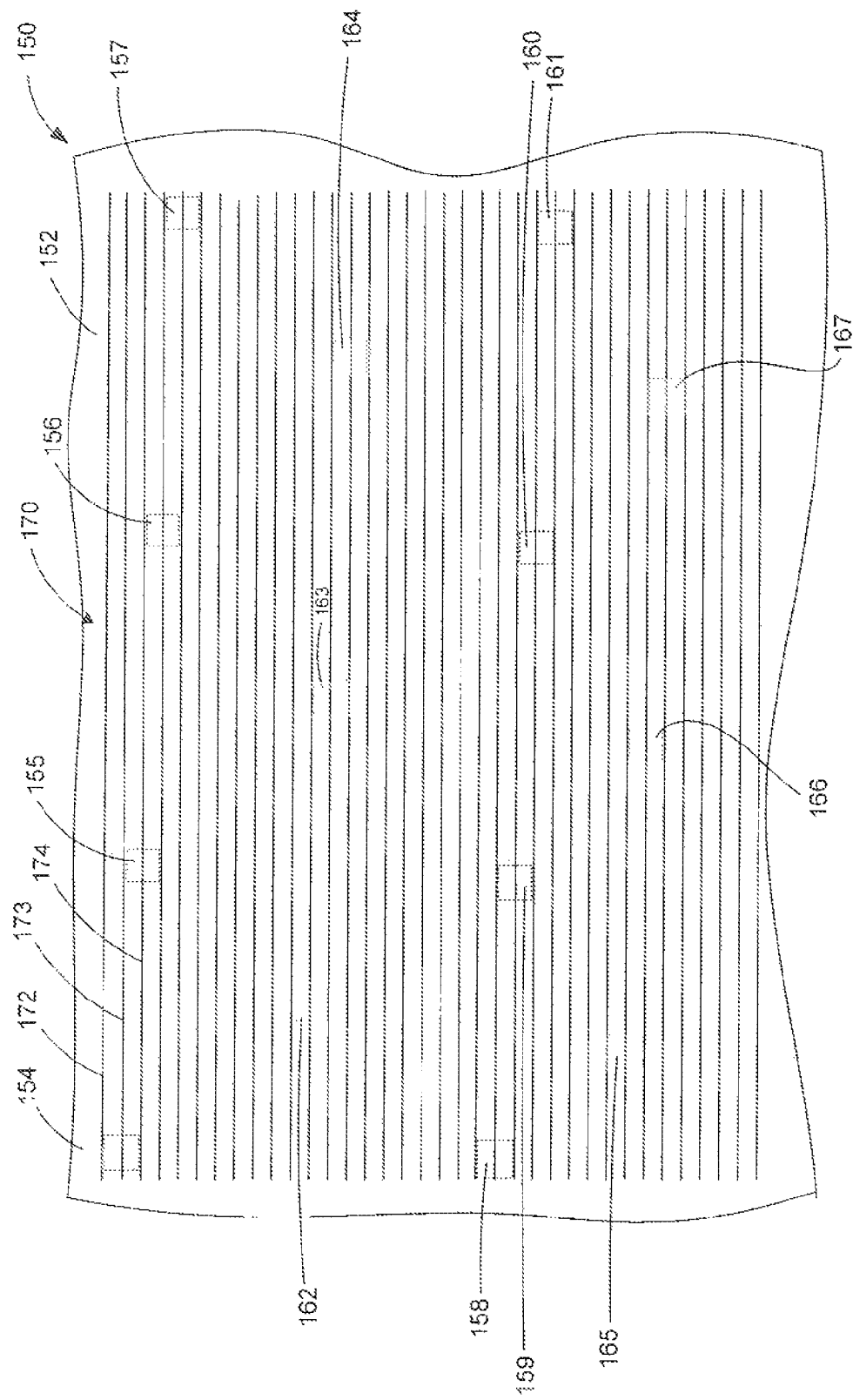

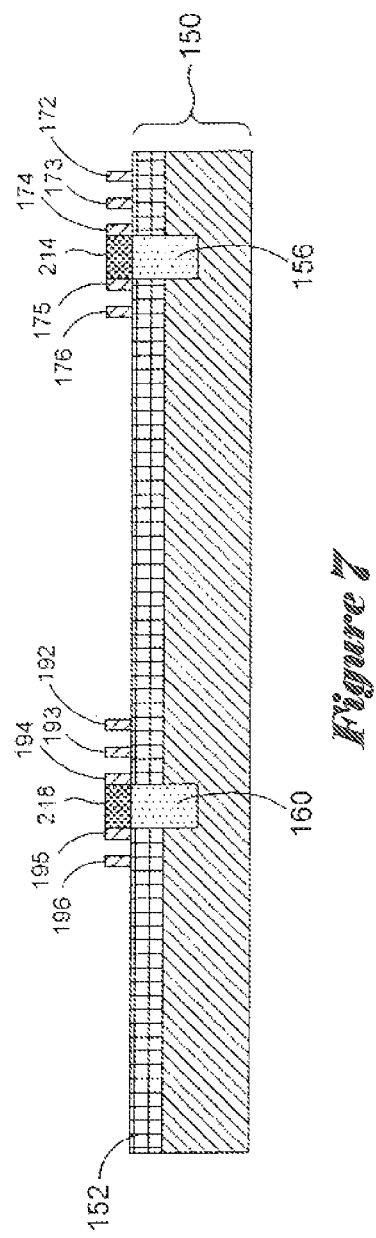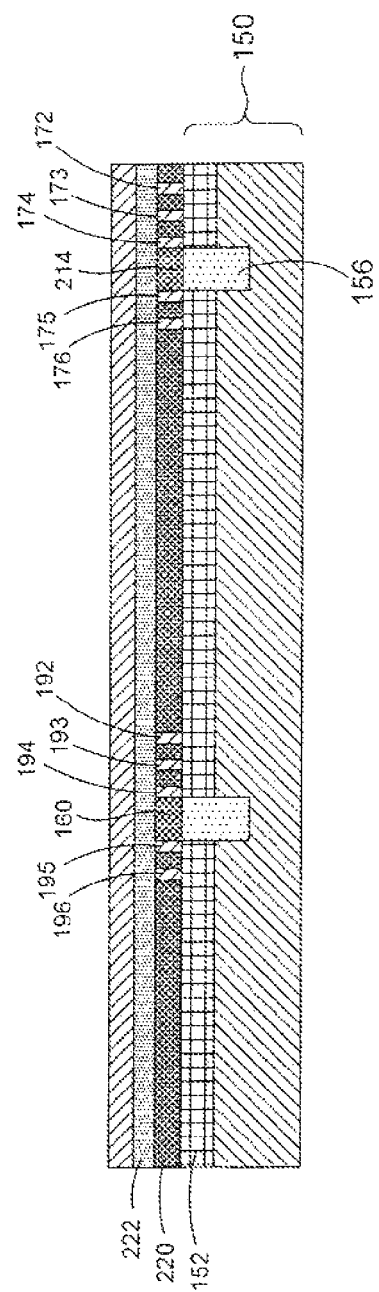

|  | A | B | C | D | E | F | G | H | I | J |
|---|---|---|---|---|---|---|---|---|---|---|
| Nanowire 405 | x |  |  |  |  |  |  |  |  |  |
| Nanowire 406 | x | x |  |  |  |  |  |  |  |  |
| Nanowire 407 | x | x | x |  |  |  |  |  |  |  |
| Nanowire 408 | x | x | x | x |  |  |  |  |  |  |
| Nanowire 409 |  | x | x | x | x |  |  |  |  |  |
| Nanowire 410 |  |  |  | x | x | x |  |  |  |  |
| Nanowire 411 |  |  |  | x | x | x | x |  |  |  |
| Nanowire 412 |  |  |  |  | x | x | x | x |  |  |
| Nanowire 413 |  |  |  |  |  | x | x | x | x |  |
| Nanowire 414 |  |  |  |  |  |  | x | x | x | x |

*Figure 20A*

|  | A | B | C | D | E | F | G | H | I | J |
|---|---|---|---|---|---|---|---|---|---|---|
| Nanowire 405 | x(0) |  |  |  |  |  |  |  |  |  |
| Nanowire 406 | x(0) | x(0) |  |  |  |  |  |  |  |  |
| Nanowire 407 | x(0) | x(0) | x(0) |  |  |  |  |  |  |  |
| Nanowire 408 | x(0) | x(0) | x(0) | x(0) |  |  |  |  |  |  |
| Nanowire 409 |  | x(0) | x(0) | x(0) | x(0) |  |  |  |  |  |
| Nanowire 410 |  |  |  | x(0) | x(0) | x(0) |  |  |  |  |
| Nanowire 411 |  |  |  | x(0) | x(0) | x(0) | x(0) |  |  |  |
| Nanowire 412 |  |  |  |  | x(0) | x(0) | x(0) | x(0) |  |  |
| Nanowire 413 |  |  |  |  |  | x(0) | x(0) | x(0) | x(0) |  |
| Nanowire 414 |  |  |  |  |  |  | x(0) | x(0) | x(0) | x(0) |

*Figure 20B*

|              | A    | B    | C    | D    | E    | F    | G    | H    | I    | J    |
|--------------|------|------|------|------|------|------|------|------|------|------|
| Nanowire 405 | x(0) |      |      |      |      |      |      |      |      |      |
| Nanowire 406 | x(0) | x(1) |      |      |      |      |      |      |      |      |
| Nanowire 407 | x(0) | x(1) | x(0) |      |      |      |      |      |      |      |
| Nanowire 408 | x(0) | x(1) | x(0) | x(0) |      |      |      |      |      |      |
| Nanowire 409 |      | x(0) | x(0) | x(0) | x(0) |      |      |      |      |      |
| Nanowire 410 |      |      | x(0) | x(0) | x(0) | x(0) |      |      |      |      |
| Nanowire 411 |      |      |      | x(0) | x(0) | x(0) | x(0) |      |      |      |
| Nanowire 412 |      |      |      | x(0) | x(0) | x(0) | x(0) |      |      |      |
| Nanowire 413 |      |      |      |      | x(0) | x(0) | x(0) | x(0) |      |      |
| Nanowire 414 |      |      |      |      |      | x(0) | x(0) | x(0) | x(0) |      |

*Figure 20C*

|              | A    | B    | C    | D    | E    | F    | G    | H    | I    | J    |
|--------------|------|------|------|------|------|------|------|------|------|------|
| Nanowire 405 | x(0) |      |      |      |      |      |      |      |      |      |
| Nanowire 406 | x(0) | x(1) |      |      |      |      |      |      |      |      |
| Nanowire 407 | x(0) | x(0) | x(1) |      |      |      |      |      |      |      |
| Nanowire 408 | x(0) | x(0) | x(1) | x(0) |      |      |      |      |      |      |
| Nanowire 409 |      | x(0) | x(1) | x(0) | x(0) |      |      |      |      |      |
| Nanowire 410 |      |      | x(0) | x(0) | x(0) | x(0) |      |      |      |      |
| Nanowire 411 |      |      |      | x(0) | x(0) | x(0) | x(0) |      |      |      |
| Nanowire 412 |      |      |      | x(0) | x(0) | x(0) | x(0) |      |      |      |
| Nanowire 413 |      |      |      |      | x(0) | x(0) | x(0) | x(0) |      |      |
| Nanowire 414 |      |      |      |      |      | x(0) | x(0) | x(0) | x(0) |      |

*Figure 20D*

|  | A | B | C | D | E | F | G | H | I | J |
|---|---|---|---|---|---|---|---|---|---|---|
| Nanowire 405 | x(0) | | | | | | | | | |
| Nanowire 406 | x(0) | x(1) | | | | | | | | |
| Nanowire 407 | x(0) | x(0) | x(1) | | | | | | | |
| Nanowire 408 | x(0) | x(0) | x(0) | x(1) | | | | | | |
| Nanowire 409 | | x(0) | x(0) | x(1) | x(0) | | | | | |
| Nanowire 410 | | | x(0) | x(1) | x(0) | x(0) | | | | |
| Nanowire 411 | | | | x(0) | x(0) | x(0) | x(0) | | | |
| Nanowire 412 | | | | | x(0) | x(0) | x(0) | x(0) | | |
| Nanowire 413 | | | | | | x(0) | x(0) | x(0) | x(0) | |
| Nanowire 414 | | | | | | | x(0) | x(0) | x(0) | x(0) |

*Figure 20E*

|  | A | B | C | D | E | F | G | H | I | J |
|---|---|---|---|---|---|---|---|---|---|---|
| Nanowire 405 | x(0) | | | | | | | | | |
| Nanowire 406 | x(0) | x(1) | | | | | | | | |
| Nanowire 407 | x(0) | x(0) | x(1) | | | | | | | |
| Nanowire 408 | x(0) | x(0) | x(0) | x(1) | | | | | | |
| Nanowire 409 | | x(0) | x(0) | x(0) | x(1) | | | | | |
| Nanowire 410 | | | x(0) | x(0) | x(0) | x(1) | | | | |
| Nanowire 411 | | | | x(0) | x(0) | x(0) | x(1) | | | |
| Nanowire 412 | | | | | x(0) | x(0) | x(0) | x(1) | | |
| Nanowire 413 | | | | | | x(0) | x(0) | x(0) | x(1) | |
| Nanowire 414 | | | | | | | x(0) | x(0) | x(0) | x(1) |

*Figure 20F*

MIXED-SCALE ELECTRONIC INTERFACES

CROSS-REFERENCE TO RELATED APPLICATION

The present application is a divisional application of application Ser. No. 11/590,492, filed Oct. 30, 2006, now U.S. Pat. No. 7,741,204 the contents of which are incorporated by reference herein.

TECHNICAL FIELD

The present invention relates to integrated circuits and, in particular, to a mixed-scale integrated-circuit architecture suitable for densely interconnecting nanoscale electronics with microscale electronics of an integrated circuit.

BACKGROUND OF THE INVENTION

Manufacturers and designers of integrated circuits continue to relentlessly decrease the size of integrated-circuit features, such as transistors and signal lines, and correspondingly increase the density at which features can be fabricated within integrated circuits. However, manufacturers and designers have begun to approach fundamental physical limits that prevent further decreasing feature sizes in integrated circuits fabricated by conventional photolithography techniques. Research efforts have, during the past decade, turned to new, non-photolithography-based techniques for fabricating nanoscale electronics that represent a significant decrease in feature sizes from currently available, submicroscale electronics fabricated by currently available high-resolution photolithographic techniques.

In one approach to designing and fabricating nanoscale electronics, nanowire crossbars, including multiple layers of nanowires with molecular-scale widths, are fabricated by self-assembly of nanowires on surfaces. Nanowires may also be fabricated using nanoimprinting techniques. The grid-like nanowire crossbars provide a two-dimensional array of nanowire junctions representing the closest point of contacts between nanowires of a first layer, oriented in a first direction, and nanowires of a second layer, oriented in a second direction approximately perpendicular to the first direction. The nanowire junctions may be fabricated to have properties of configurable resistors, switches, diodes, transistors, and other familiar electronic components of integrated circuits.

Many different prototype nanoscale electronic circuits have been produced in research environments, and continued research efforts are producing ever-increasing palates of nanoscale-electronic components, component organizations, and fabrication methods for producing the components and component organizations. However, practical, commercial electronic devices need to include large scale and microscale components and circuits that interface to nanoscale electronic devices and circuitry. However, devising and fabricating reliable and cost-effective interfaces between microscale and submicroscale electronics and nanoscale electronics has proven to be difficult. Therefore, researchers and developers of mixed-scale electronic devices continue to seek more reliable and more easily fabricated nanoscale/microscale interfaces for use in mixed-scale electronic devices.

SUMMARY OF THE INVENTION

Various embodiments of the present invention are directed to nanoscale/microscale interfaces for mixed-scale electronic devices. In certain embodiments of the present invention, a method of fabricating a mixed-scale electronic interface is disclosed. A substrate is provided with a first set of conductive elements. A first layer of nanowires may be formed over the first set of conductive elements. A number of channels may be formed, with each of the channels extending diagonally through a number of the nanowires of the first layer. A number of pads may be formed, each of which is electrically interconnected with an underlying conductive element of the first set of conductive elements and one or more adjacent nanowires of the first layer of nanowires. The pads and corresponding electrically interconnected nanowires define a number of pad-interconnected-nanowire-units. Additional embodiments of the present invention are directed to a method of forming a nanoimprinting mold and a method of programming nanowire-to-conductive element electrical connections.

BRIEF DESCRIPTION OF THE DRAWINGS

FIG. 1 is an isometric view of an example of a two-layer nanoscale/microscale-interface that includes two pad-interconnected-nanowire units.

FIG. 2B is a top plan view of a first sub-layer of a predominantly nanoscale layer that overlays the predominantly submicroscale or microscale layer shown in FIG. 2A.

FIG. 3 is a partial, top plan view of the overall organization of conductive elements of a predominantly submicroscale or microscale layer of a two-layer nanoscale/microscale interface.

FIG. 4 is a partial, top plan view showing a first layer of nanowires formed on a surface of the submicroscale or microscale layer shown in FIG. 3.

FIG. 7 is cross-sectional view taken along line A-A shown in FIG. 6.

FIG. 8 is a cross-sectional view showing a dielectric material formed in between nanowires of the first layer of nanowires, a nanowire-junction material formed over the nanowires, and a second layer of nanowires oriented generally perpendicular to the first layer of nanowires.

FIG. 20A illustrates a connectivity map for the nanowire structure shown in FIG. 19.

FIGS. 20B through 20F illustrate the conductance states for the nonlinear-tunneling-hysteretic resistors of the nanowire structure shown in FIG. 19.

DETAILED DESCRIPTION OF THE VARIOUS EMBODIMENTS

Figure 2A:
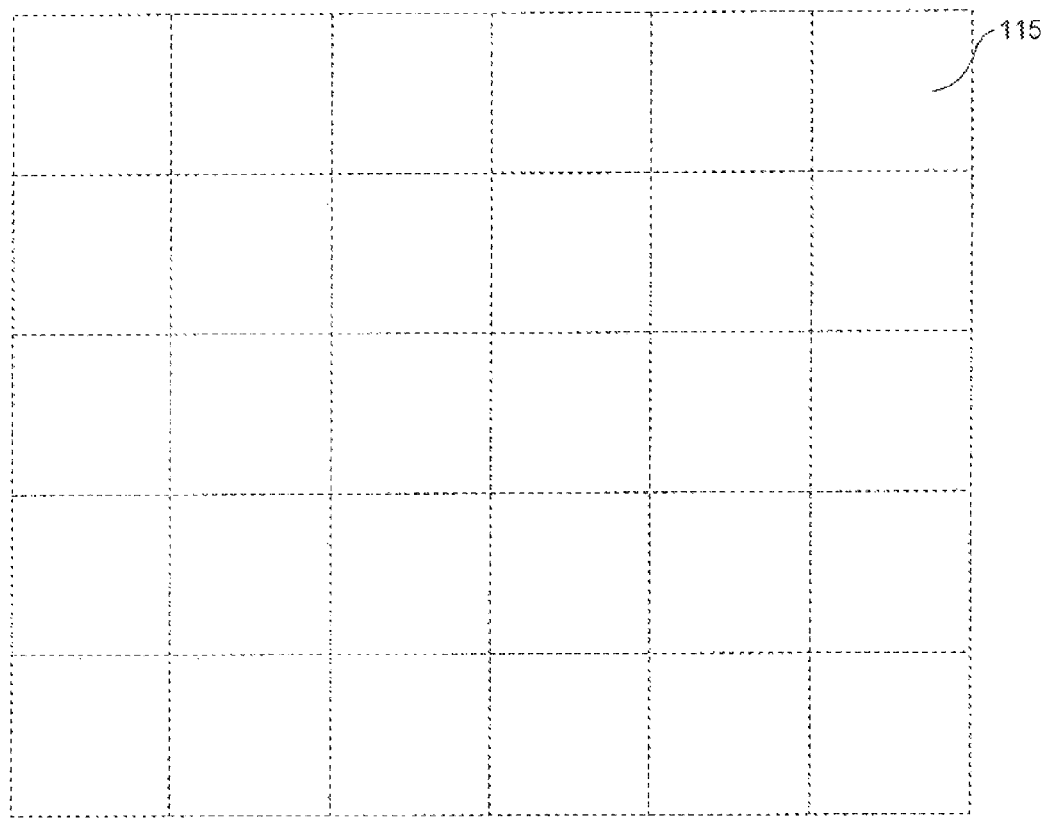
FIG. 2A is a top plan view of the overall organization of a predominantly submicroscale or microscale layer of a two-layer nanoscale/microscale interface.

Various embodiments of the present invention are directed to nanoscale/microscale interfaces for mixed-scale electronic devices that utilize pad-interconnected-nanowire-units ("PI-NUs"). In the present disclosure, the term "nanoscale" refers to features and components with at least one dimension less than about 100 nanometers (nm). The term "nanoscale" may also refer to features and components with at least one dimension less than about 50 nm, and, in certain cases, less than about 10 nm.

The term "submicroscale" generally refers to features and components with at least one dimension less than about 1 micron (μm), and the term "microscale" refers to features and components with dimensions equal to, or greater than, about 1/lm.

In order to facilitate understanding the description of the various embodiments of the present invention, an overview of nanoscale/microscale interfaces that utilize PINUs is provided in Section A. Section B describes various embodiments of the present invention directed to methods of fabricating mixed-scale electronic devices that utilize PINUs. An application of using structures formed from practicing the methods described in Section B, as a nanoimprinting mold, is discussed in Section C. Section D describes properties of non-linear-tunneling-hysteretic-resistors to assist in understanding structures and methods for programming nanowire-to-conductive element electrical connections described in Section E.

A. Nanoscale/Microscale-Interfaces Utilizing PINUs

FIG. 1 shows an example of a two-layer nanoscale/microscale-interface 100 that includes two pad-interconnected-nanowire units. The two-layer nanoscale/microscale-interface 100 includes a first microscale or submicroscale signal line 102 that electrically contacts a first pin 104. The pin 104 and signal line 102 are both embedded within the predominantly submicroscale or microscale layer of the two-layer nanoscale/microscale-interface. For example, the pin 104 and signal line 102 may be embedded within a semiconductor substrate having complementary metal oxide semiconductor ("CMOS") microelectronic devices formed within the substrate. The pin 104 and signal line 102 may be electrically connected to one or more components of a CMOS microelectronic device, such as a source, drain, or gate of the CMOS microelectronic device.

The first pin 104 also electrically contacts a pad 106. Nanowires 118 and 119 extend in opposite directions from the pad 106. The pad 106 and the nanowires 118 and 119 attached to the pad 106 together form a first PINU 108 of one sub-layer of a predominantly nanoscale layer of the two-layer nanoscale/microscale-interface 100. The first PINU 108 resides in a first sub-layer of the predominantly nanoscale layer of the nanoscale/microscale interface 100. A second submicroscale or microscale signal line 110 electrically contacts a second pin 112. The second pin 112 also electrically contacts a pad 114 of a second PINU 116. The second PINU 116 also includes nanowires 120 and 121 that extend in opposite directions. The second PINU 116 resides within a second sub-layer of the predominantly nanoscale layer of the two-layer nanoscale/microscale interface 100.

The nanowires 118 and 120 of the PINUs 108 and 116 intersect at a nanowire junction 122. The nanowire junction 122 may include one or a small number of molecules that implement a passive or active nanoscale electrical component, such as a resistor, a variable-resistance resistor, a diode, a transistor, or other passive or active component. The pair of pins 104 and 112 of the predominantly microscale layer of a two-layer nanoscale/microscale interface 100 are electrically interconnected via the pair of PINUs 108 and 116 and the single nanowire junction 122.

In certain types of electronic devices that incorporate the two-layer nanoscale/microscale interface 100 shown in FIG. 1, including mixed-scale integrated circuits, the predominantly microscale and submicroscale layer may implement various types of logic and functional units. The predominantly nanoscale layer may serve primarily to interconnect the various submicroscale or microscale components and logic. By using nanoscale electronics for component and logic interconnection, the area and power consumption of a mixed-scale integrated circuit or other electronic device can both be significantly decreased.

FIG. 2A illustrates an example of the overall organization of a predominantly submicroscale or microscale layer of a two-layer nanoscale/microscale interface. The predominantly submicroscale or microscale layer of the two-layer nanoscale/microscale interface may be organized into square or rectangular cells to form a rectilinear grid of microscale cells 115. FIG. 2A shows only a small portion of the predominantly microscale layer of the two-layer nanoscale/microscale interface that includes 30 microscale cells 115. The rectilinear organization of the predominantly microscale layer reflects only the arrangements of submicroscale or microscale pins (e.g., the pins 104 and 112 shown in FIG. 1) within the predominantly microscale layer. The underlying submicroscale or microscale circuitry and components may not be so regularly patterned and may not otherwise conform to the rectilinear pattern illustrated in FIG. 2A. In general, each of the microscale cells 115 contains a small number of submicroscale or microscale pins (e.g., the pins 104 and 112 shown in FIG. 1) that are identically arranged and positioned in each of the microscale cells 115 of the rectilinear grid.

FIG. 2B shows the organization and pattern of a first sub-layer of the predominantly nanoscale layer that overlays the predominantly submicroscale or microscale layer shown in FIG. 2A. The first sub-layer of the predominantly nanoscale layer includes PINUs 132 arranged so that centers C of pads 130 of the PINUs 132 fall on linear columns 124 and rows 126. One of the rows 126 is shown as a horizontal dashed line 126, and one of the columns 124 is shown as a vertical dashed line 124 through the centers C of a column of pads 130. The PINUs 132, including both of the pads 130 and nanowires 134 of each of the PINUs 132, are rotated by a small angle θ with respect to the row direction (represented by the dashed row line 126). Rotation of the PINUs 132 allows the nanowires 134 of the PINUs 132 to form closely spaced nanowire bundles, such as closely spaced nanowire bundle 136, oriented at the small angle θ with respect to the row 126. In the illustrated example of the first sub-layer of the predominantly nanoscale layer shown in FIG. 2B, the rows 126 and columns 124 that define the center of the PINUs 132 form square cells 122. However, the columns 124 need not be perpendicular to the rows 126, and the cells 122 may be rhomboid. The centers C of the pads 130 of the first nanoscale sub-layer are positioned to generally overlie approximately one-half of the pins (e.g., pins 104 shown in FIG. 1) in the predominantly microscale layer of the two-layer nanoscale/microscale interface, with the remaining pins centered within each square cell 122 of the first nanoscale sub-layer.

Figure 2C:
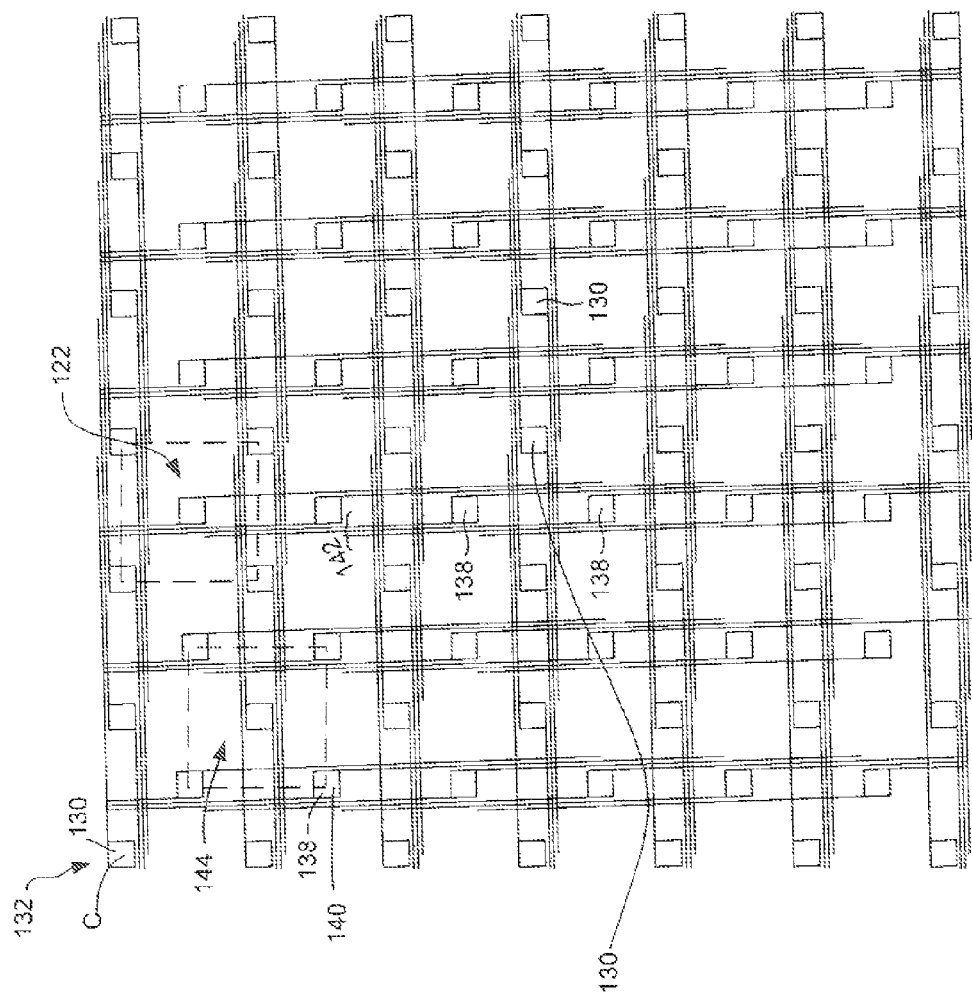
FIG. 2C is a top plan view of a second sub-layer of a predominantly nanoscale layer that overlays the first sub-layer shown in FIG. 2B.

FIG. 2C shows the organization and patterning of a second nanoscale sub-layer that overlies the first nanoscale sub-layer shown in FIG. 2B to form a small portion of a tessellated, predominately nanoscale layer of the two-layer nanoscale/microscale-interface. The second nanoscale sub-layer may be identical in organization to the first nanoscale sub-layer shown in FIG. 2B, but is rotated approximately 90 degrees with respect to the first nanoscale sub-layer and translated, by 1/√2 times the pad-repeat distance along columns 124 and rows 126 of the first nanoscale sub-layer, in a diagonal direction, so that the pads 138 of the second nanoscale sub-layer are located at the centers of the cells 122 formed by the pads 130 of the first nanoscale sub-layer and so that each of the second-sub-layer pads 138 is, in the case of square cells, approximately equidistant from the nearest one of the surrounding pads 130 of the first nanoscale sub-layer. The rows and columns of the pads 138 of the second nanoscale sub-layer form square cells 144. In this organization, the nanowires 140 of the second nanoscale sub-layer form parallel, closely spaced bundles, such as parallel, closely spaced bundle 142, perpendicular to the parallel, closely spaced bundles of the nanowires 134 of the first nanoscale sub-layer.

In the predominantly nanoscale layers shown in FIGS. 2B and 2C, the nanowires of the PINUs have a length equal to approximately three times the repeat distance of pads in the column and row directions of the nanoscale sub-layer that contains the PINU. For example, the nanowire 140 emanating from the pad 138 of the second nanoscale sub-layer spans three of the pads 138 with of the first nanoscale sub-layer, which have pad-repeat distances equal to those in the second nanoscale sub-layer. However, the nanowires may have much greater lengths with respect to the pad repeat distance, as long as a nanowire in one layer is not positioned so closely to a pin or pad in the other layer that there is an undesired electrical interaction between the two. The longer the nanowires, the more nanowires that may be present in each parallel, closely spaced bundle of nanowires.

B. Embodiments of Methods of the Present Invention for Fabricating PINUs

FIGS. 3 through 13 illustrate various embodiments of methods for fabricating PINUs according to the present invention. FIG. 3 shows a partial, top plan view of a substrate 150. The substrate 150 includes a first set of microscale or submicroscale conductive elements 154-161 exposed through a dielectric layer 152. The substrate 150 further includes a second set of microscale or submicroscale conductive elements 162-167 exposed through the dielectric layer 152. The conductive elements 154-167 reside within a microscale or submicroscale layer of the substrate 152. The conductive elements 154-167 are arranged to form a lattice. As shown in FIG. 3, the conductive elements 154, 155, 158, and 159 form a microscale cell with the conductive element 162 located at approximately a center of the microscale cell. Although only the conductive elements 154-167 are illustrated in FIG. 3, many additional conductive elements may be present within the substrate 150 to form additional microscale cells.

The conductive elements 154-167 provide the electrical connections for semiconductor devices embedded within the substrate 150. For example, the substrate 150 may be a semiconductor substrate including embedded semiconductor devices, such as CMOS microelectronic devices, and each of the conductive elements 154-167 may be electrically coupled to components of the CMOS microelectronic devices. The conductive elements 154-167 may be formed of a variety of electrically conductive materials, including conductive polymers, metals or alloys, or doped semiconductor materials.

As shown in the plan view of FIG. 4, a first layer of generally parallel, closely-spaced nanowires 170 is formed on the dielectric layer 152 and the conductive elements 154-167 of the substrate 150 to form a first sub-layer of a two-layer nanoscale/microscale interface. Individual nanowires may be positioned adjacent to each of the conductive elements 154-167. For example, as shown in FIG. 4, nanowires 172 and 174 are positioned adjacent to opposing sides of the conductive element 154.

The first layer of nanowires 170 may be formed on the substrate 150 using a variety of different fabrication techniques. In one embodiment of the present invention, the first layer of nanowires 170 is formed on the substrate 150 using a nanoimprinting process that may employ a mold patterned by a superlattice-nanowire-pattern-transfer ("SNAP") method. In other embodiments of the present invention, the first layer of nanowires 170 may be fabricated using a variety of well-known, self-assembly techniques such as epitaxial growth or another suitable self-assembly technique.

Figure 5:
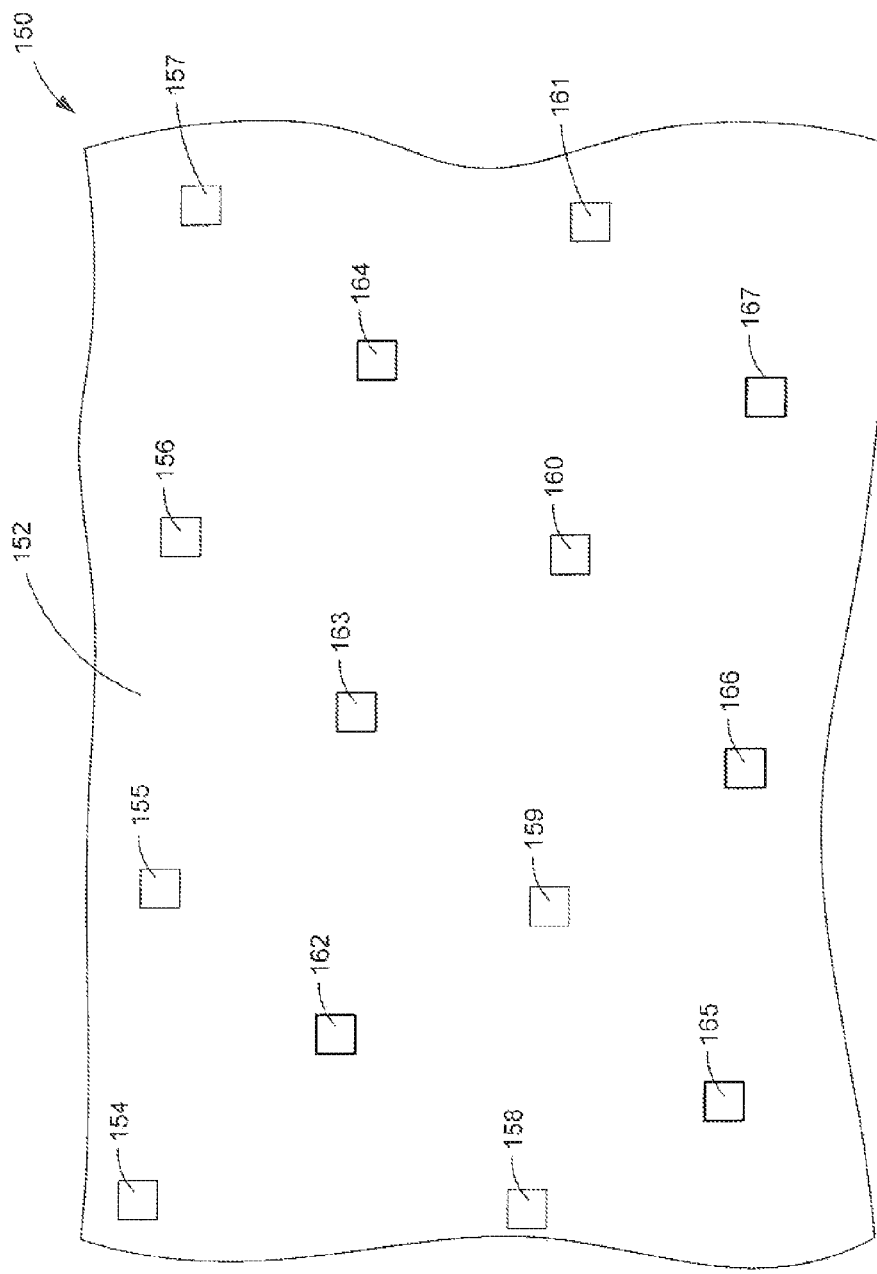
FIG. 5 is a partial, top plan view showing portions of the first layer of nanowires removed to form channels that extend diagonally through a number of the nanowires.
Figure 5:
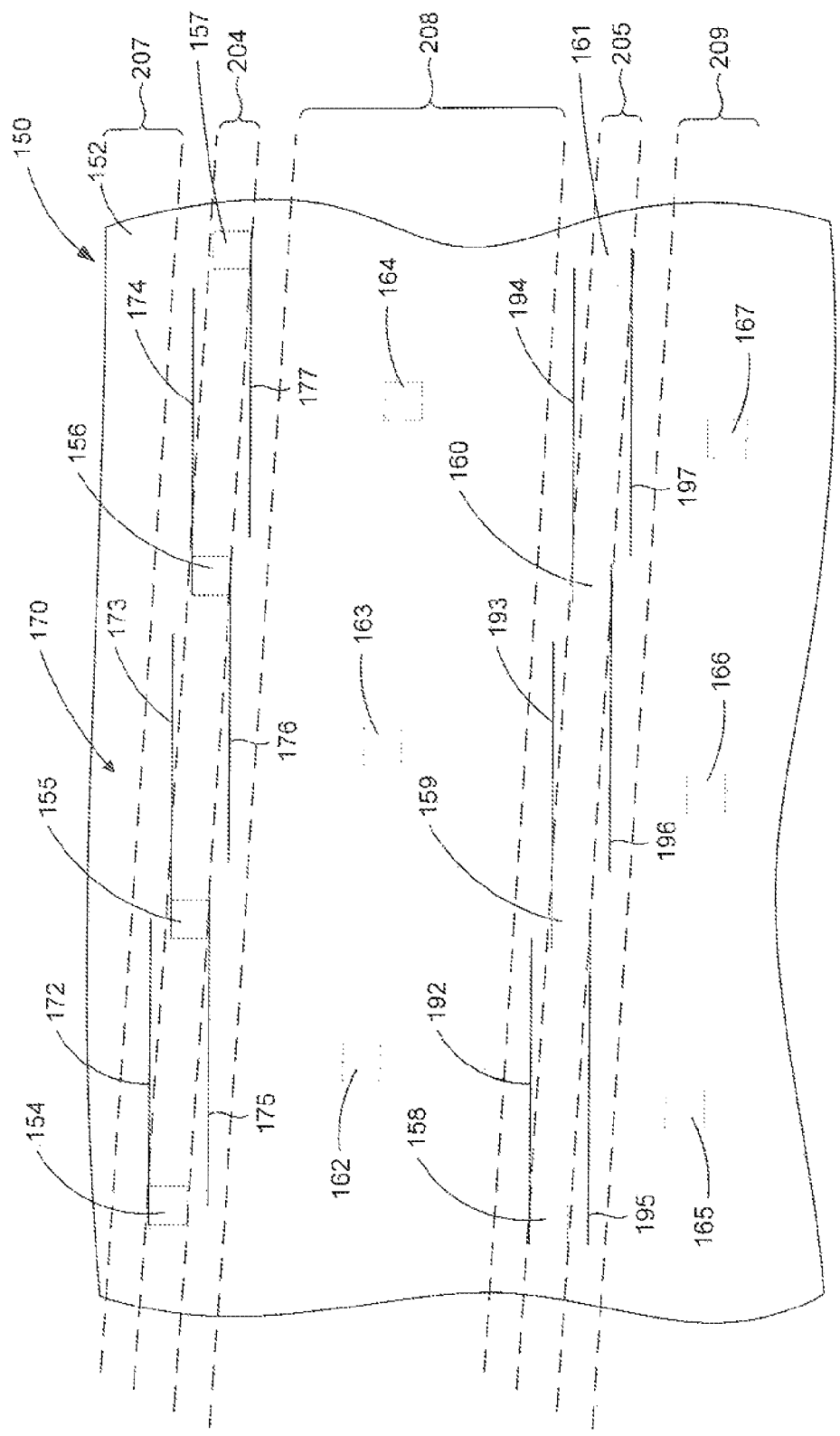

As shown in the top plan view of FIG. 5, after forming the first layer of nanowires 170, portions of individual nanowires extending between adjacent conductive elements may be removed to form channels 204 and 205. For example, a portion of the nanowire 173 that spans between the conductive elements 154 and 155 and a portion of the nanowire 174 that spans between the conductive elements 155 and 156 may be removed. Each of the channels 204 and 205 extends diagonally across and through generally parallel nanowires of the first layer of nanowires 170. Additionally, nanowires of the first layer of nanowires 170 may also be removed within channels 207-209, although the channel 208 is the only one of the channels 207-209 completely shown in FIG. 5. Forming the channels 207-209 also equalizes the lengths of the remaining nanowires of the first layer of nanowires 170. For example, removing nanowires from within the channel 208 removes multiple, adjacent nanowires of the first layer of nanowires 170 and also removes portions of the nanowire 175-177 and 192-194 so that the nanowires may have approximately the same length.

The channels 204, 205, and 207-209 may be formed using a variety of different material removal processes. In various embodiments of the present invention, the channels 204, 205, and 207-209 may be formed by selectively removing portions of the first layer of nanowires 170 using a focused ion beam ("FIB"), an electron beam, or by photolithographically patterning a mask and etching to remove the selected nanowire portions.

Figure 6:
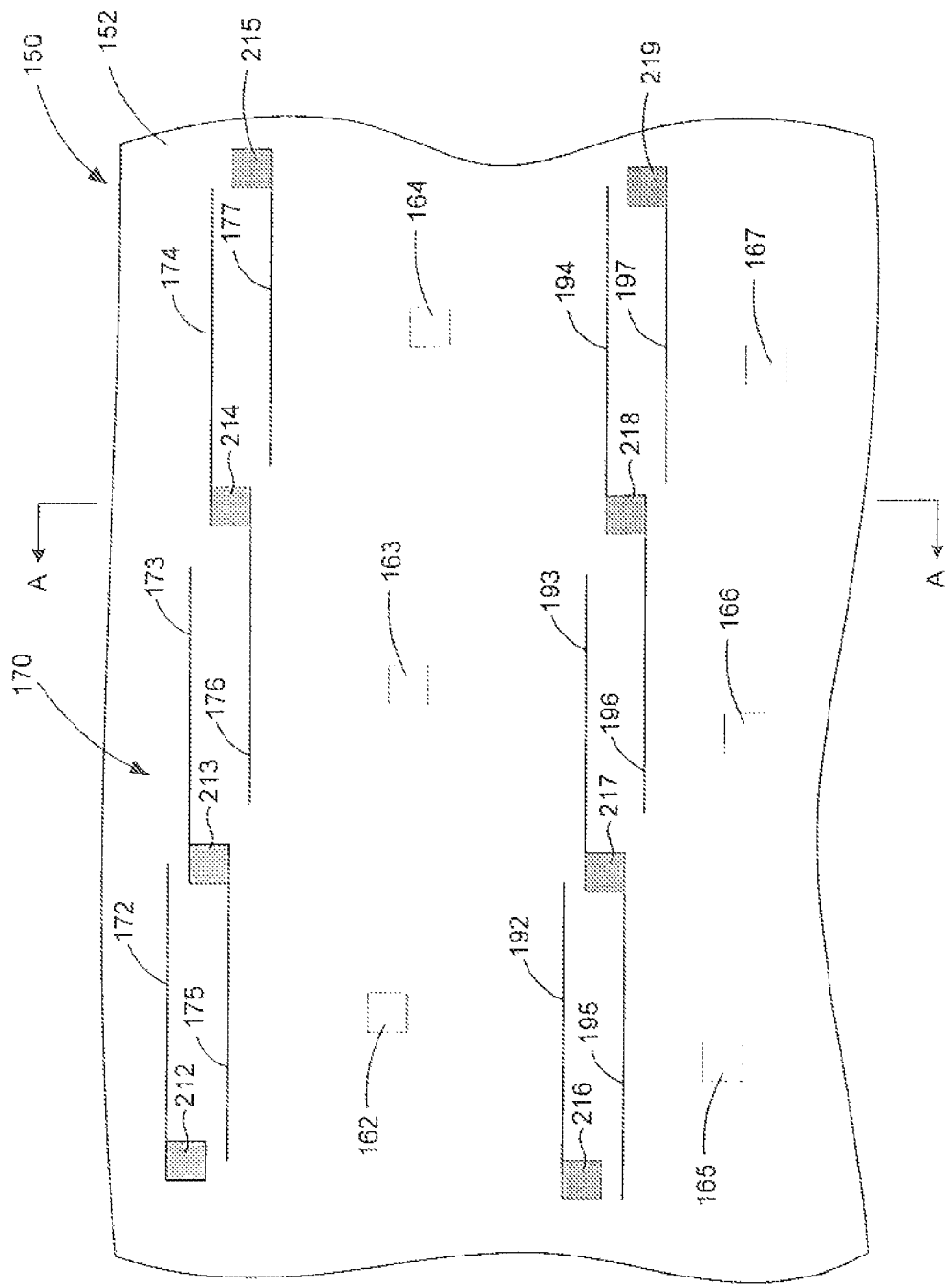
FIG. 6 is a partial, top plan view showing pads formed within the diagonally extending channels shown in FIG. 5 that electrically interconnect one or more adjacent nanowires to an underlying conductive element.

As shown in the top plan view of FIG. 6 and the cross-sectional view of FIG. 7, pads 212-219 may be formed over the corresponding conductive elements 154-161 shown in FIG. 5. The pads 212-219 are formed over the first set of conductive elements 154-161 to form a first set of PINUs that reside in the first nanoscale sub-layer. In one embodiment of the present invention, the pads 212-219 may be formed by photographically patterning a photoresist applied over the first layer of nanowires 170. The photoresist may be photolithographically patterned to form vias that are positioned over the corresponding conductive elements 154-161. A conductive-pad material made from a metal, alloy, or doped semiconductor material may be deposited within the vias using chemical vapor deposition ("CVD"), physical vapor deposition ("PVD"), atomic layer deposition ("ALD"), or another suitable deposition process to fill the vias. Lateral dimensions of the vias may gradually increase in a direction toward the substrate 150 so that the conductive-pad material of each of the pads 212-219 reliably electrically contacts individual nanowires of the first layer of nanowires 170 adjacent to the vias. Any excess conductive-pad material and photoresist may be removed using an etching process so that only the conductive-pad material located within the vias remains, thus, forming the pads 212-219. Each of the pads 212-219 creates an electrical connection between the corresponding underlying conductive elements 154-161 of the substrate 150 and one or more nanowires of the first layer of nanowires 170.

In another embodiment of the present invention, each of the pads 212-219 of the first set of PINUs may be formed using a shadow-mask evaporation deposition process. In such an embodiment, the acts of applying and exposing the photoresist, stripping the photoresist, and removing excess conductive-pad material may be omitted because the conductive-pad material may be deposited only over the corresponding conductive elements 154-161. The pads 212-219 may be formed by evaporating conductive-pad material that passes through openings in a mask that are aligned with the conductive elements 154-161 of the substrate 150.

As shown in the cross-sectional view of FIG. 8, after forming the pads 212-219, a dielectric material 220 (e.g., silicon oxide, silicon nitride, or an insulting polymer) may be deposited between each of the nanowires of the first layer of nanowires 170 using CVD, ALD, or another suitable deposition process. Then, a layer of nanowire-junction material 222 may deposited on the dielectric material 220. As will be discussed in more detail below, portions of the nanowire-junction material 222 ultimately forms nanowire junctions between a second set of PINUs and the first set of PINUs. The nanowire-junction material 222 may be, in certain embodiments of the present invention, a variably resistive material that may reversibly transition between a relatively high-conductance state and a relatively low-conductance state upon application of two different state-transition voltages. Such a material allows nanowire junctions to be configured electronically to either electrically interconnect two nanowires that cross at a nanowire junction or to electrically isolate the two nanowires from one another. In additional embodiments of the present invention, other types of nanowire-junction materials 222 may be deposited to produce other types of nanowire-junction components. In certain embodiments of the present invention, multiple layers may be deposited in order to produce multi-layer nanowire junctions.

Figure 9:
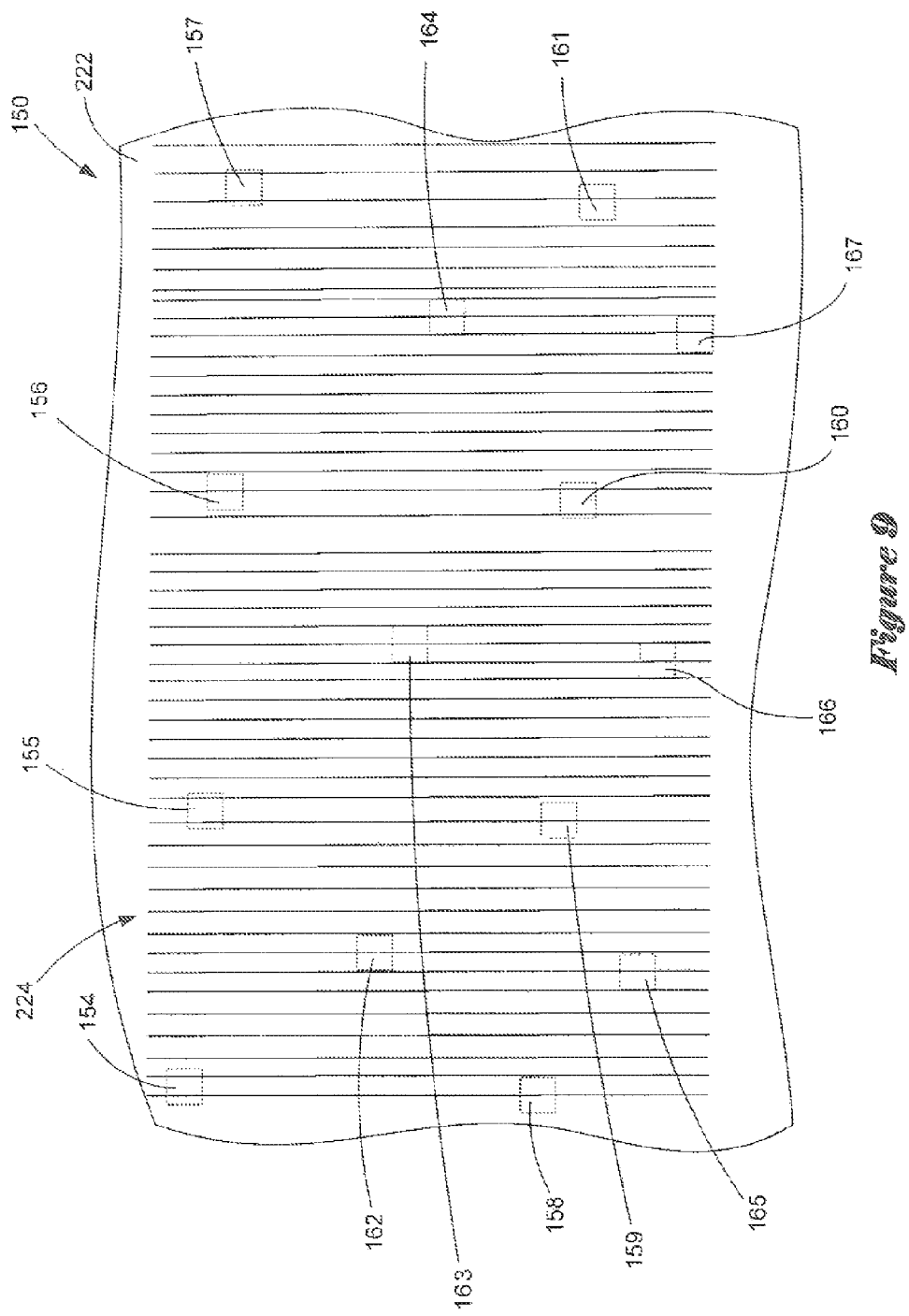
FIG. 9 is a partial, top plan view of FIG. 8 showing the second layer of nanowires that overlies the first layer of nanowires.

As shown in the top plan view of FIG. 9, next, a second layer of generally parallel, closely-spaced nanowires 224 may be formed on the nanowire-junction material 222 using any of the previously described techniques for forming nanowires. The second layer of nanowires 224 forms a second sub-layer of the two-layer nanoscale/microscale interface. Each of the nanowires of the second layer of nanowires 224 is oriented generally perpendicular to the nanowires of the first layer of nanowires 170.

PINUs are also formed from the second layer of nanowires 224 in a manner very similar to that employed with the first layer of nanowires 170 as described above with reference to FIGS. 4 through 6. As shown in the top plan view of FIG. 10, portions of individual nanowires of the second layer of nanowires 224 extending between adjacent conductive elements may be removed to form channels 226-228 using a FIB, an electron beam, or a photolithography process in a manner similar to the process described above with reference to FIG. 5. Each of the channels 226-228 extends diagonally across and through generally parallel nanowires of the second layer of nanowires 224. Additionally, nanowires of the second layer of nanowires 224 may also be removed within channels 229-232, although the channels 230 and 231 are the only channels completely shown in FIG. 10. Forming the channels 229-232 also equalizes the lengths of the remaining nanowires of the first layer of nanowires 224. For example, removing nanowires from within the channel 230 removes multiple, adjacent nanowires of the second layer of nanowires 224 and also removes portions of the nanowire 229 and 230 so that the nanowires of the second layer of nanowires 224 may have approximately the same length.

Figure 10:
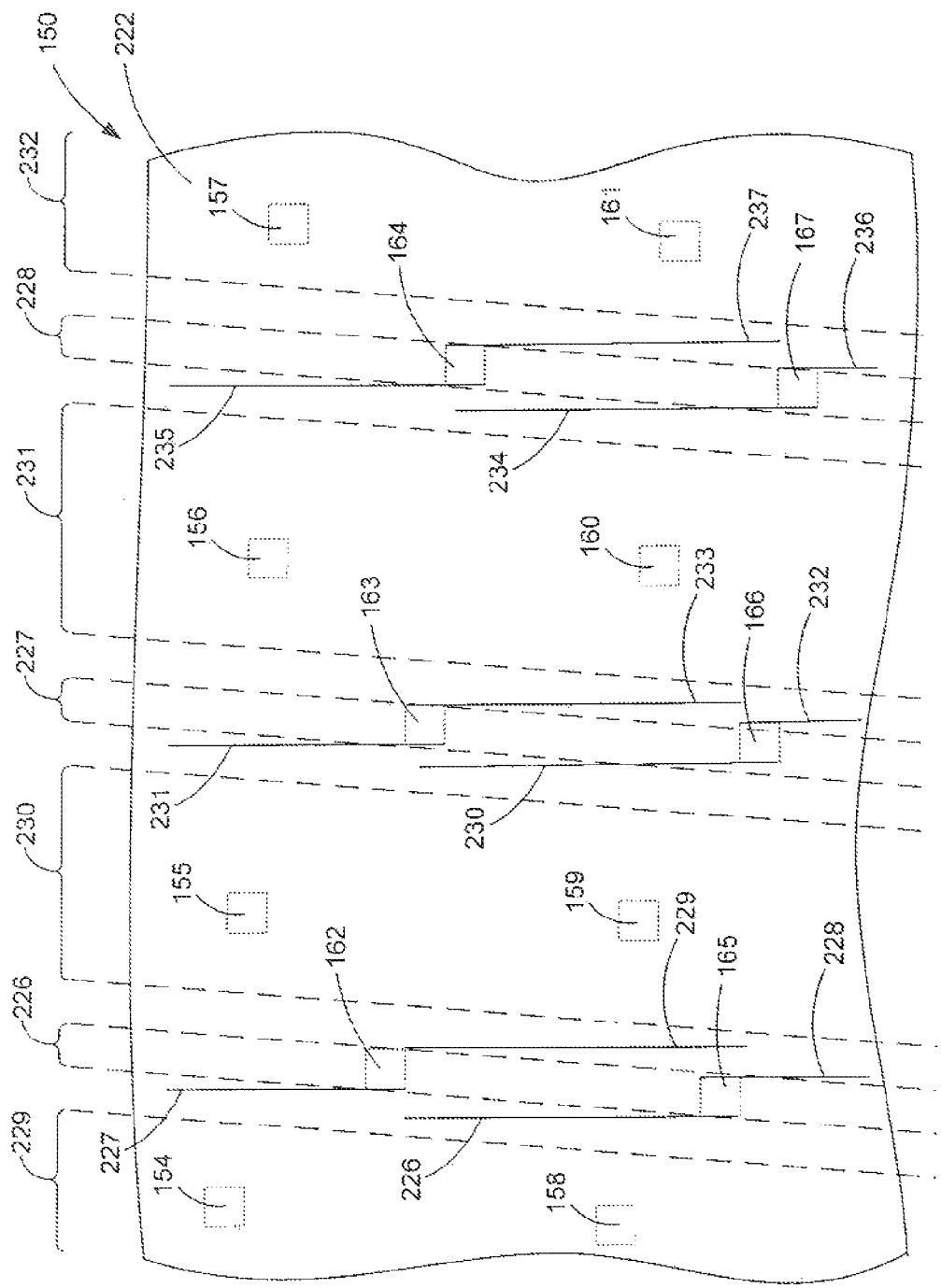
FIG. 10 is a partial, top plan view showing portions of the second layer of nanowires removed to form channels that extend diagonally through a number of the nanowires of the second layer.
Figure 11:
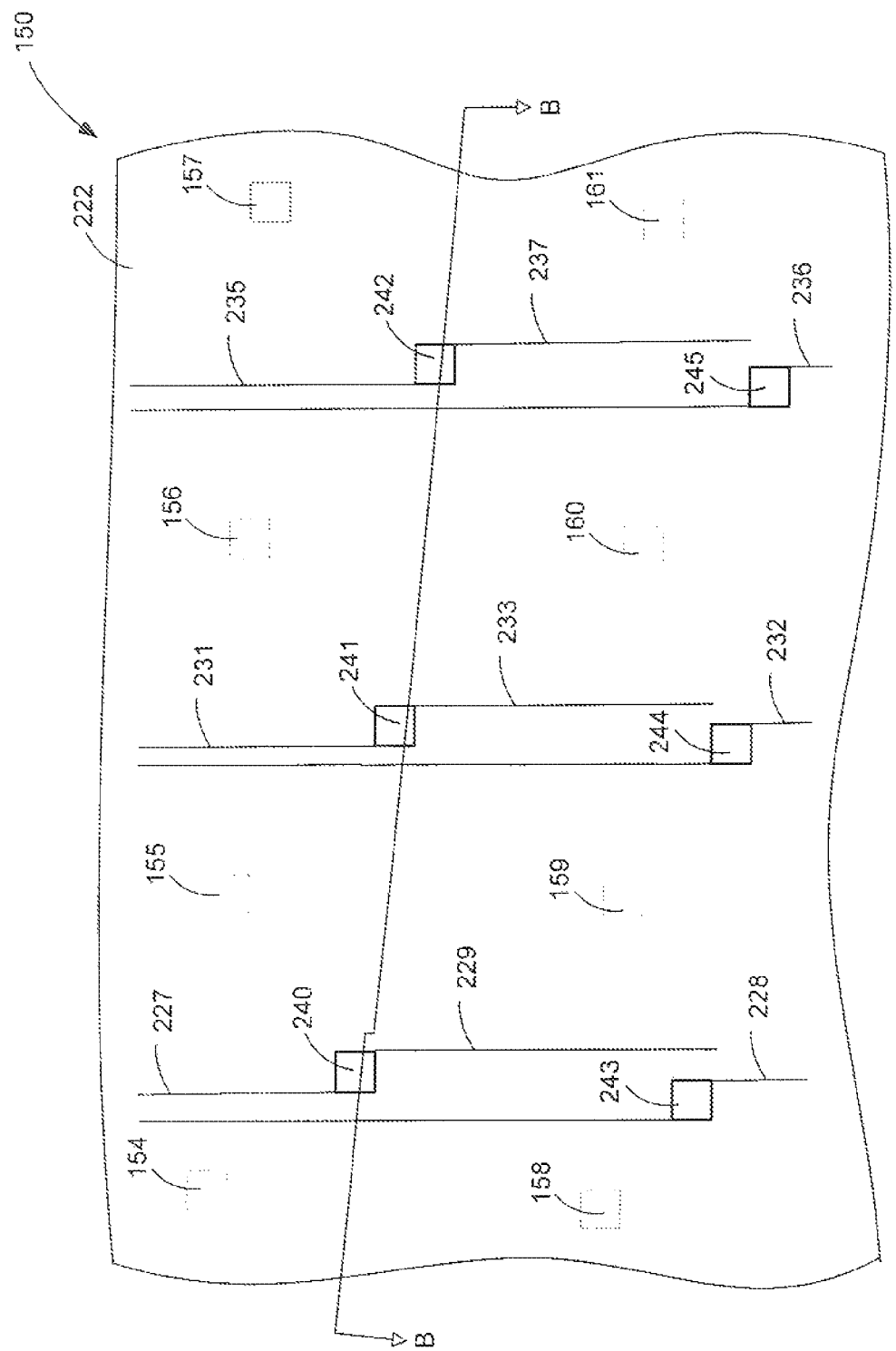
FIG. 11 is a partial, top plan view showing pads formed within the diagonally extending channels shown in FIG. 10 that electrically interconnect one or more adjacent nanowires to an underlying conductive element.
Figure 12:
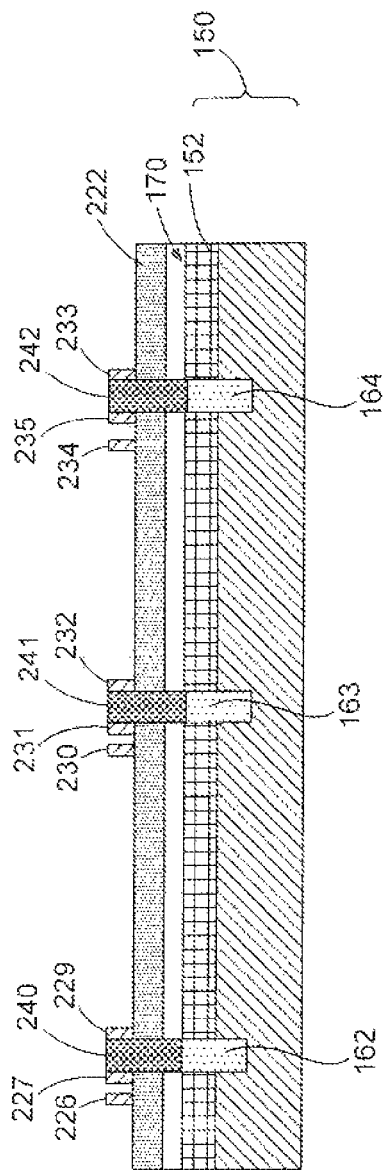
FIG. 12 is a cross-sectional view taken along line B-B shown in FIG. 11.
Figure 13:
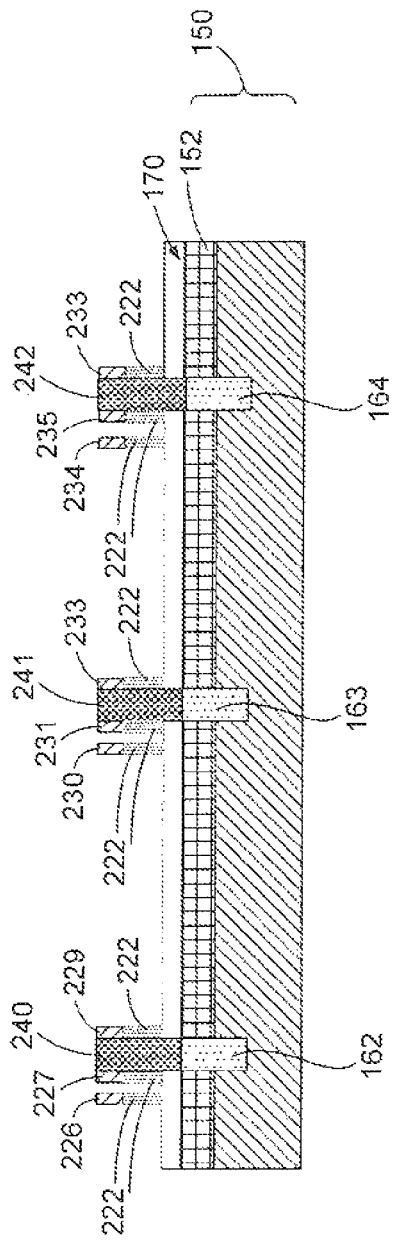
FIG. 13 is a cross-sectional view showing the pads formed within the second layer of nanowires and the nanowire junctions that electrically interconnect a PINU of the first sub-layer to PINUs of the second sub-layer.

As shown in the top plan view of FIG. 11, pads 240-245 may be formed over underlying corresponding conductive elements 162-167 (FIG. 10). The pads 240-245 form the pads of a second set of PINUs that reside in the second sub-layer of the two-layer nanoscale/microscale interface. As shown in FIG. 12, vias may be formed through the dielectric material 220 (not shown in FIG. 12) and the nanowire-junction material 222 to expose the top surface of the underlying conductive elements 162-167 (FIG. 10). For example, the vias may be formed using deep reactive ion etching ("DRIE") or another suitable anisotropic etching process. The pads 240-245 of the second set of PINUs are formed by depositing conductive-pad material within the vias. After removal of excess conductive-pad material, the pads 240-245 are formed. The pads 240-245 electrically interconnect the underlying conductive elements 162-167 to individual nanowires of the second layer of nanowires 224 that are adjacent to the pads 240-245. As shown in FIG. 13, after forming the second set of PINUs, portions the nanowire-junction material 222 between adjacent nanowires of the second layer of nanowires 224 may be selectively removed so that the nanowire-junction material 222 remains only under each of the nanowires of the second layer of nanowires 224. The second set of PINUs may be coated with one or more protective layers, as needed for a particular application, to protect the two-layer nanoscale/microscale interface.

After fabricating the two-layer nanoscale/microscale-interface shown in FIG. 13, the nanowire-junction material 222 located along the underside of each of the nanowires of the second layer of nanowires 224 may be configured to electrically interconnect the first set of PINUs to the second set of PINUs at nanowire junctions using a number of currently available configuration processes. Utilizing currently available configuration processes, each of the nanowire junctions may be configured as a resistor, a variable-resistance resistor, a diode, a transistor, or other passive or active component to electrically connect each of the PINUs of the first set to one of the PINUs of the second set in a manner similar to the nanoscale/microscale interface 100 shown in FIG. 1. Additionally, in other embodiments of the present invention, one or more additional layers of nanowires may be fabricated over the second layer of nanowires 224 in the same or similar manner as described with respect to the embodiments shown in FIGS. 3 through 13.

In another embodiment of the present invention, the second layer of nanowires 224 may be formed directly on and over the first set of PINUs. In such an embodiment, the dielectric material 220, nanowire-junction material 222, or both may be omitted. The channels 226-232 may be formed through the second layer of nanowires 224, for example, using a selective material removal process. For example, the composition of the nanowires of the first layer 170 may be different than the composition of the nanowires of the second layer 224. Prior to forming the pads 240-245, a selective removal process may be used that is capable of selectively removing portions of the nanowires of the second layer of nanowires 224 to form the channels 226-232.

It should also be emphasized that there are an almost limitless number of different configurations that may be used in the disclosed embodiments for two-layer nanoscale/microscale interfaces. Pad-repeat distances may vary, angles between rows and columns of pads may depart from 90°, and pad-cornered cells of the tessellated, predominantly nanoscale layer may be, in addition to squares and rectangles, diamond shaped or rhomboid in nature. Furthermore, the pad geometry and the length of the nanowires may be varied from the illustrated configurations. Additionally, for any given arrangement of PINUs, there are a number of other symmetry-related arrangements with equivalent pad spacings and column and row orientations. In three-dimensional networks of PINUs and other features and components within multiple nanoscale sub-layers, a much larger number of symmetry related arrangements for any given arrangement may be possible.

C. Embodiments of the Present Invention Directed to Nanoimprinting Molds

An additional embodiment of the present invention is directed to a method of fabricating a nanoimprinting mold. The first set of PINUs of the in-process substrate structure shown in FIGS. 6 and 7 may be used as a nanoimprinting mold. During use, the geometry of the PINUs may be defined in a nanoimprint resist by pressing the PINUs into the nanoimprint resist. Pressing the PINUs into the nanoimprint resist forms an imprinted pattern of the PINUs within the nanoimprint resist. Portions of the nanoimprint resist at the base of the imprinted pattern may be removed using an anisotropic etching process to expose a substrate that underlies the nanoimprint resist. Conductive material may be deposited within the imprinted pattern in the nanoimprint resist to form PINUs on the substrate that correspond to size and geometry of the PINUs of the nanoimprinting mold.

D. Properties of Nonlinear-Tunneling Resistors

Before discussing various embodiments of the present invention for programming a nanowire-to-conductive element electrical connection using a nonlinear-tunneling-hysteretic resistor ("NTHRs"), a brief description of the behavior of nonlinear-tunneling resistors and NTHRs is provided below.

A current flowing between a conductive element (e.g., one of the conductive elements 154-147 shown in FIG. 3) and a nanowire interconnected by junction molecules functions as a nonlinear-tunneling resistor. The nonlinear-tunneling resistor may be modeled by the current-voltage equation:

$$I = \frac{1}{2}(ke^{aV} - ke^{-aV}) = k\sinh(aV)$$

where I is current flowing through the crossbar junction;
V is a voltage across the crossbar junction;
k is the quasi-conductance of the crossbar junction; and
a is a voltage scale factor.

The quasi-conductance, k, and scale factor, a, are parameters determined by the physical properties of junction molecules. The scale factor a represents resistive properties of the junction and may be used to characterize changes in the current flowing through the junction based on changes in the voltages between the overlapping nanowires. The parameter k is analogous to the conductance, $g=1/R$, of a linear resistor, where R represents resistance. A nonlinear-tunneling resistor that operates in accordance with the current-voltage equation given above is called a "tunneling resistor."

One particularly important type of nonlinear-tunneling resistor is a reconfigurable NTHR. Using currently available techniques, reconfigurable NTHRs may be fabricated at a junction between a nanowire and a conductive element to produce reconfigurable nonlinear-tunneling-resistor junction, called a "nonlinear-tunneling-hysteretic-resistor junction" or "NTHR junction." The resistance of a NTHR junction may be controlled by applying state-transition voltages that cause the NTHR junction to alternate between two bistable resistance states. In one resistance state, the NTHR junction has a relatively low resistance, which corresponds to high-conductance state that is represented by the binary value "1," and in the other resistance state, the NTHR junction has a relatively high resistance, which corresponds to a low-conductance state that is represented by the binary value "0."

Figure 14:
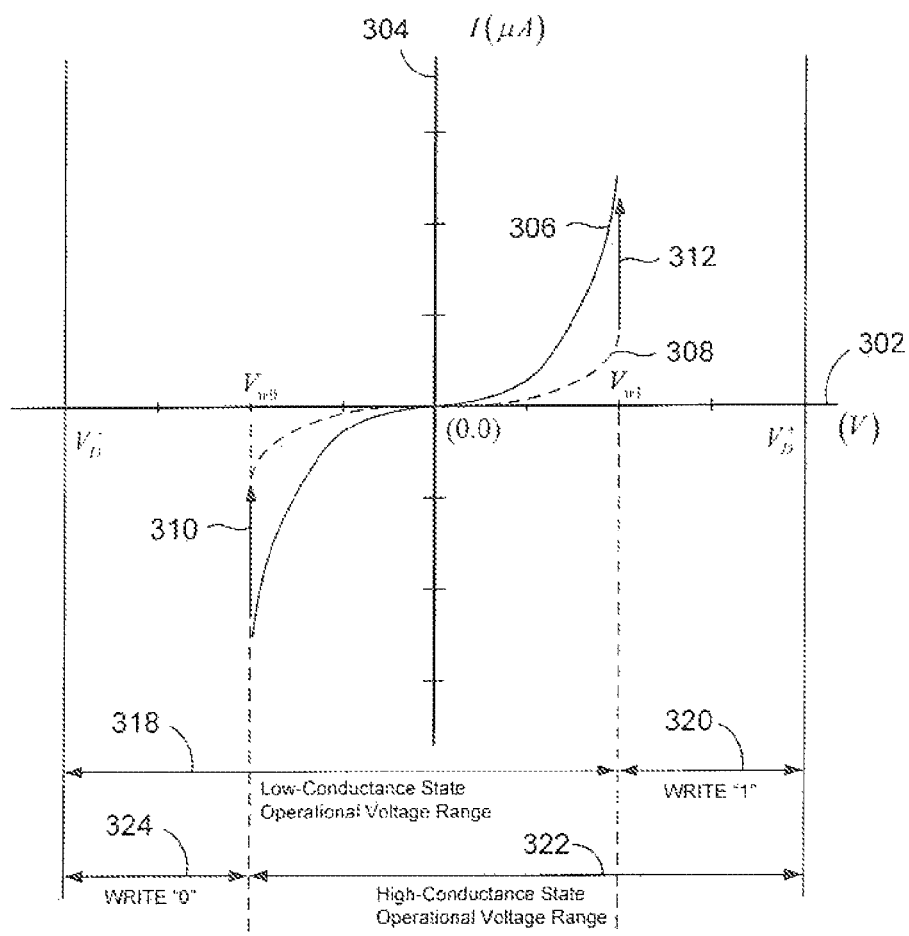
FIG. 14 is a graph that illustrates the operational characteristics of a nonlinear-tunneling-hysteretic-resistor junction and resistance-state transitions under operational control voltages.

FIG. 14 is a graph illustrating the operational characteristics of a NTHR junction and resistance-state transitions under operational control voltages. In FIG. 14, horizontal line 302 represents a voltage axis, and vertical line 304 represents a current axis. The voltage axis 302 is incremented in volts (V), and the current axis 304 is incremented in microamperes (μA). Curve 306 represents a high-conductance state of the NTHR junction, and dashed-line curve 308 represents the low-conductance state of the same NTHR junction. The high-conductance state represented by the curve 306 typically represents a Boolean value or memory state "1," and the low-conductance state represented by the curve 308 typically represents a Boolean value or memory state "0." Applying voltages outside the voltage range $[V_D^-, V_D^+]$ destroys the tunneling-hysteretic-resistor junction. Voltages $V_{w1}$ and $V_{w0}$ represent WRITE "1" and WRITE "0" threshold voltages. When the NTHR junction is in the low-conductance state 308, applying a voltage in the WRITE "1" voltage range $[V_{w1}, V_D^+]$ 320 causes the NTHR junction to transition to the high-conductance state 306, as indicated by directional arrow 312. When the NTHR junction is in the high-conductance state 306, applying a voltage in the WRITE "0" voltage range $[V_D^-, V_{w0}]$ 324 causes the NTHR junction to transition to the low-conductance state 308, as indicated by directional arrow 310.

The NTHR junction shown in FIG. 14 may be operated as follows. Consider the NTHR junction initially in a low-conductance state 308. The NTHR junction may be operated as a low-conductance state resistor by applying voltages in a voltage range $[V_D^-, V_{w0}]$ 318. However, applying a voltage in the WRITE "1" voltage range 320, causes the NTHR junction to immediately transition from the low-conductance state 308 to the high-conductance state 306. As a result, the NTHR junction can now be operated as a high-conductance state resistor by applying voltages in a voltage range [$V_{w0}, V_D^+$] 322. By applying a voltage in the WRITE "0" voltage range 324, the NTHR junction transitions from the high-conductance state 306 back to the low-conductance state 308.

Tunneling resistors, including tunneling-hysteretic-resistors, have a number of properties in common with linear resistors. For example, tunneling resistors may also be connected in parallel and series. The behavior of NTHRs arranged in series is particularly relevant to understanding the various embodiments of the present invention that will be discussed below in Section E.

NTHRs may be schematically illustrated with an open triangle to represent a NTHR in a low-conductance state and a solid triangle to represent a NTHR in a high-conductance state. FIGS. 15A through 18B illustrate the operational behavior of NTHR resistors connected in series after application of different state-transition voltages.

Figure 15A:
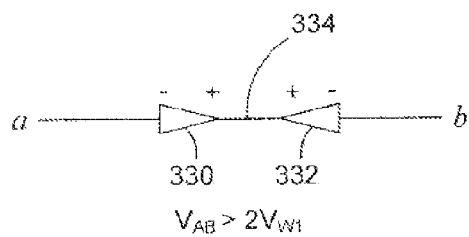
FIGS. 15A through 18B schematically illustrate a pair of nonlinear-tunneling-hysteretic resistor junction in series that are subjected to various voltages to selectively switch the resistance states of the nonlinear-tunneling-hysteretic resistor junctions.
Figure 15B:
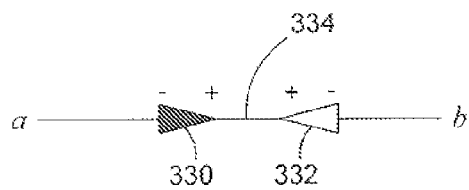

FIG. 15A shows NTHRs 330 and 332 arranged in series interconnected by a wire 334. Each of the NTHRs 330 and 332 is in a low-conductance state. The polarities of the NTHRs 330 and 332 are opposite to each other. When a state-transition voltage $V_{ab}$, with a polarity aligned with the polarity of the NTHR 330 and a magnitude greater than $2*V_{w1}$ is applied across points a and b, the NTHR 330 transitions to a high-conductance state while the NTHR 332 remains in a low-conductance state. Due to the NTHRs 330 and 332 having opposite polarities and the polarity of the voltage $V_{ab}$ being aligned with the polarity of the NTHR 330, the conductance-state-transition behavior of the NTHR 330 is governed by the upper-right quadrant of the graph shown in FIG. 14. Additionally, the conductance-state-transition behavior of the NTHR 332 is governed by the lower-left quadrant of the graph shown in FIG. 14. The state-transition voltage $V_{ab}$ tends to cause the NTHR 332 to transition to a low-conductance state. However, since the NTHR 332 is already in the low-conductance state, the voltage $V_{ab}$ does not change the conductance state of the NTHR 332. FIG. 15B shows the NTHRs 330 and 332 after application of the state-transition voltage $V_{ab}$.

Figure 16A:
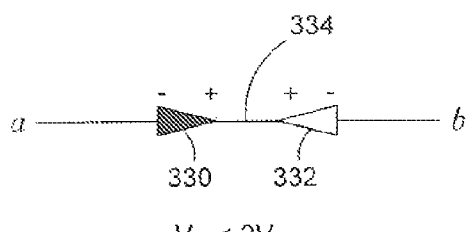
Figure 16B:
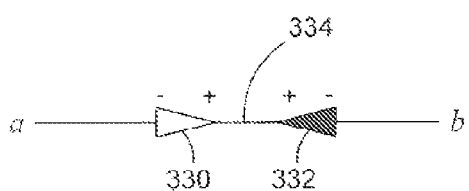

As shown in FIG. 16A, a state-transition voltage $V_{ab}$ with a polarity aligned with the polarity of the NTHR 332 and a magnitude greater than greater than $2*V_{w0}$ is applied across points a and b. As shown in FIG. 16B, the NTHR 330 transitions to a low-conductance state and the NTHR 332 transitions to a high-conductance state. Initially, the applied state-transition voltage $V_{ab}$ causes the NTHR 332 to transition to a high-conductance state because the NTHRs 330 and 332 are arranged in series and the relatively higher resistance of the NTHR 332 carries most of the applied state-transition voltage $V_{ab}$. After transitioning the NTHR 332 to the high-conductance state, the NTHRs 330 and 332 evenly divide the state-transition voltage $V_{ab}$ and, subsequently, the NTHR 330 transitions to a low-conductance state. Due to the NTHRs 330 and 332 having opposite polarities and the polarity of the voltage $V_{ab}$ being aligned with the polarity of the NTHR 332, the NTHR 330 conductance-state-transition behavior is governed by the lower-left quadrant of the graph shown in FIG. 14. Additionally, the NTHR 332 conductance-state-transition behavior is governed by the upper-right quadrant of the graph shown in FIG. 14.

Figure 17B:
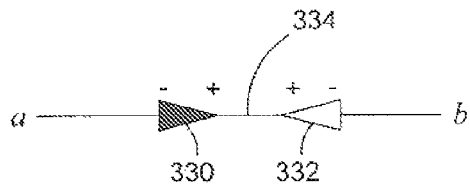
Figure 17A:
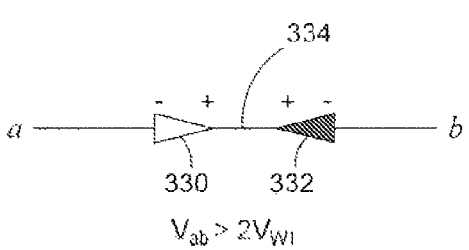

As shown in FIG. 17A, a state-transition voltage $V_{ab}$ having a polarity aligned with the polarity of the NTHR 330 and a magnitude greater than greater than $2*V_{w1}$ is applied across points a and b. As shown in FIG. 17B, the NTHR 330 transitions to a high-conductance state while the NTHR 332 transitions to a low-conductance state.

Figure 18A:
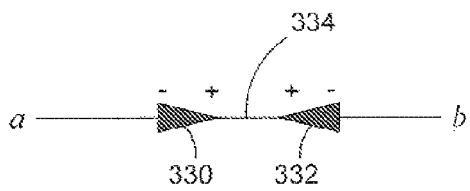
Figure 18B:
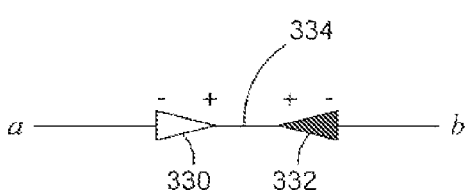

When both of the NTHRs 330 and 332 are in a high-conductance state, one of the NTHRs 330 and 332 may be switched to a low-conductance state by applying a voltage greater than $2*V_{w0}$ across points a and b. As shown in FIGS. 18A and 18B, when a state-transition voltage of greater than $2*V_{w0}$ having a polarity opposite the polarity of the NTHR 330 is applied across points a and b, the NTHR 330 switches to a low-conductance state while the NTHR 332 remains in the high-conductance state.

E. Embodiments of the Present Invention for Programming Nanowire-to-Conductive Element Electrical Connections PINUs are an effective nanowire structure for establishing an electrical connection between nanowires and underlying microscale or submicroscale circuitry of a substrate. However, additional embodiments of the present invention are directed to different techniques for establishing an electrical connection between nanowires and underlying microscale or submicroscale circuitry of a substrate. The additional embodiments are directed to selectively programming a NTHR junction located between a nanowire and a conductive element.

Figure 19:
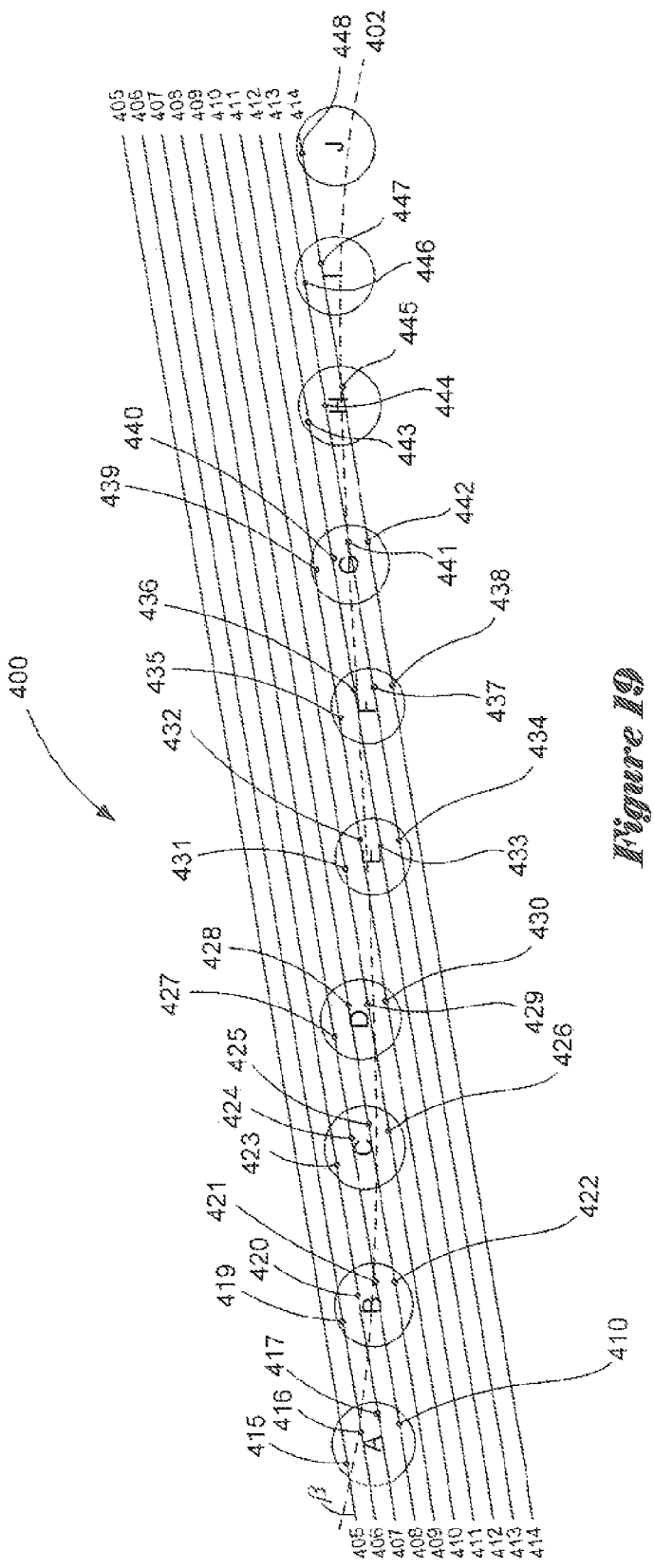
FIG. 19 is a schematic plan view of a representative nanowire structure in which some of the conductive elements of a substrate are overlaid by several nanowires.

FIG. 19 shows a representative nanowire structure 400 that includes one or more rows 402 of conductive elements A-J, equivalent to the conductive elements 154-167 shown in FIG. 3, that may be electrically coupled to CMOS microelectronic devices embedded within a substrate. Nanowires 405-414 may be formed over the conductive elements A-J using a number of well-known, currently available techniques. As shown in FIG. 19, some of the conductive elements A-J are overlaid by one or more of the nanowires 405-414. The nanowires 405-414 and the row 402 of conductive elements A-J are rotated by a small angle β relative to each other.

A layer of switching material that exhibits nonlinear-hysteretic resistive properties is disposed between the nanowires 405-414 and the conductive elements A-J. In the nanowire structure 400 shown in FIG. 19, the switching material is configured to form NTHR junctions 415-448, each of which is represented by a solid dot.

In one method embodiment of the present invention, a connectivity map, detailing the nanowires 405-414 and conductive elements A-J that are electrically coupled to each other, may be determined prior to programming the NTHR junctions 415-448. The connectivity map may be determined by applying a voltage between different pairs of the conductive elements A-J and measuring current through particular nanowires 405-414 responsive to the applied voltage. Although the NTHR junctions 415-448 are, initially, in a low-conductance state, a small, measurable current may still flow through the NTHR junctions 415-448. FIG. 20A is a connectivity map of the nanowire structure 400, with the row 402 of conductive elements A-J arranged as the columns and the nanowires 405-414 arranged as the rows. The "x" symbols shown in FIG. 20A indicate that a particular nanowire 405-414 is electrically coupled to a particular conductive element A-J via a particular NTHR junction 415-448.

After determining the connectivity map, the connectivity map is evaluated to determine a configuration for the NTHR junctions 415-448 that maximizes the number of electrical connections between individual nanowires 405-414 and conductive elements A-J using different NTHR junctions 415-448 configured in a high-conductance state. Then, the NTHR junctions 415-448 are selectively programmed.

One embodiment of the present invention discussed below, illustrates how the NTHR junctions 415-448 may be selectively configured to maximize the number of electrical connections between individual nanowires 405-414 and conductive elements A-J via NTHRs in the high-conductance state.

As indicated in FIG. 20B, all of the NTHR junctions 415-448 are initially in the low-conductance state, which is represented by the symbol string "x(0)."

Figure 21:
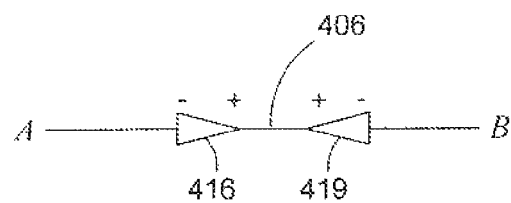
FIG. 21 is a diagram of a circuit between two conductive elements shown in FIG. 19.

A schematic representation of a circuit between two of the conductive elements A-J, such as conductive elements A and B, is shown in FIG. 21. The conductive elements A and B are coupled to each other via NTHR junctions 416 and 419 arranged in series, with the nanowire 406 coupled to the NTHR junctions 416 and 419. A state-transition voltage having a magnitude greater than $2*V_{w1}$, with a polarity aligned with the polarity of the NTHR junction 419 coupling nanowire 406 to the conductive element B, is applied across conductive elements A and B. This applied state-transition voltage switches the NTHR junction 419 to a high-conductance state, represented in FIG. 20C by the symbol string x(1). Additionally, after applying the state-transition voltage between conductive elements A and B, the NTHR junctions 420 and 421 coupling nanowires 407 and 408 to the conductive element B are also temporarily switched to a high-conductance state x(1).

Then, as shown in FIG. 20D, a state-transition voltage having a magnitude greater than $2*V_{w0}$, with a polarity aligned with the polarity of the NTHR junction 423 coupling nanowire 407 to the conductive element C, is applied between conductive elements B and C. The applied state-transition voltage switches the NTHR junction 423 to a high-conductance state. The applied state-transition voltage across the conductive elements B and C also switches the NTHR junctions 420 and 421 back to a low-conductance state as indicated in FIG. 20D. As shown in FIG. 20E, then, a state-transition voltage having a magnitude greater than $2*V_{w0}$, with a polarity aligned with the polarity of the NTHR junction 427 coupling nanowire 408 to the conductive element D, is applied between conductive elements C and D. The applied state-transition voltage switches the NTHR junction 427 to a high-conductance state. The applied voltage between conductive elements C and D also switches the NTHR junction 424 coupling the conductive element C to the nanowire 408 back to a low-conductance state.

This process is continued by applying a state-transition voltage having a magnitude greater than $2*V_{w0}$, between conductive elements D and E, E and F, F and G, F and H, H and I, and I and J until each of the nanowires 406-414 is coupled to a different one of the conductive elements A-J via a different one of the NTHR junctions 415-448 in a high-conductive state. FIG. 20F shows the conductance states for the NTHR junctions 415-448 after the process is completed.

The above-described process of consecutively applying an appropriate state-transition voltage between consecutive pairs of adjacent conductive elements A-J along the row 402 allows each of the nanowires 406-414 to be electrically coupled to a different one of the conductive elements A-J via a single high-conductance-state NTHR junction from among the NTHR junctions 415-448. The remaining NTHR junctions are configured in the low-conductance state. It should be emphasized that the nanowire structure 400, shown in FIG. 19, is merely one representative connectivity pattern in which the NTHRs may be selectively programmed. The methodology described above may also be used with other types of connectivity patterns.

Although only a single layer of nanowires is shown in FIG. 19, a second layer of nanowires may be formed over the nanowires 405-414, with each of the nanowires of the second layer oriented generally perpendicular to the nanowires 405-414 of the first layer. The second layer of nanowires may also be selectively coupled to a different row or column of conductive elements in the same or similar manner as previously described with respect to FIG. 19. Individual nanowires of the second layer may cross the underlying nanowires 405-414 at nanowire junctions to form a nanowire-crossbar array. The nanowire junctions coupling the nanowires 406-414 and the nanowires of the second layer may be made from a nanowire junction material having a lower state-transition voltage than the NTHR junctions 415-448 so that configuring the nanowire junctions does not also reconfigure the NTHR junctions 415-448. The nanowire junctions between the first and second layers of nanowires may be selectively configured, for example, by applying an appropriate state-transition voltage between individual conductive elements associated with the first layer of nanowires and individual conductive elements associated with the second layer of nanowires or another suitable configuration technique.

Although the present invention has been described in terms of particular embodiments, it is not intended that the present invention be limited to these embodiments. Modifications within the spirit of the present invention will be apparent to those skilled in the art. For example, in the above-described embodiments of the present invention, NTHR junctions 405-448 are initially in the low-conductance state before selectively programming the NTHR junctions 405-448. In an alternative embodiment of the present invention, the NTHR junctions 405-448 may be initially configured in a high-conductance state. In such an embodiment, the NTHR junctions 405-448 may be selectively switched to a low-conductance state so that a portion of the NTHR junctions 405-448 remain in a high-conductance state to establish an electrical connection between at least a portion of the nanowires 406-414 and different conductive elements A-J using NTHR junctions in a high-conductance state.

The foregoing description, for purposes of explanation, used specific nomenclature to provide a thorough understanding of the present invention. However, it will be apparent to one skilled in the art that the specific details are not required in order to practice the present invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the present invention and its practical applications, to thereby enable others skilled in the art to best utilize the invention and various embodiments with various modifications as are suited to the particular use contemplated. It is intended that the scope of the present invention be defined by the following claims and their equivalents.

What is claimed is:

1. A method of programming nanowire-to-conductive element electrical connections, the method comprising:

with a substrate comprising a number of embedded conductive elements that are overlaid with a first layer of nanowires, at least some of the conductive elements electrically coupled to more than one of the nanowires through individual switching junctions created between the first layer of nanowires and a second layer of nanowires overlaying the first layer of nanowires and running substantially perpendicular to the first set of nanowires, each of the switching junctions configured in either a low-conductance state or a high-conductance state, switching a portion of the switching junctions from the low-conductance state to the high-conductance state or the high-conductance state to the low-conductance state so that individual nanowires of the first layer of nanowires are electrically coupled to a different one of the conductive elements of the number of conductive elements using a different one of the switching junctions configured in the high-conductance state.

2. The method of claim 1 wherein switching a portion of the switching junctions further comprises applying a state-transition voltage between pairs of adjacent conductive elements of the number of conductive elements.

3. The method of claim 1 wherein switching a portion of the switching junctions further comprises consecutively applying a state-transition voltage between pairs of adjacent conductive elements of the number of conductive elements.

4. The method of claim 1 wherein each of the switching junctions is configured in the low-conductance state prior to the act of switching a portion of the switching junctions.

5. The method of claim 1 wherein each of the switching junctions is configured in the high-conductance state prior to the act of switching a portion of the switching junctions.

6. The method of claim 1 wherein each of the switching junctions comprises a nonlinear-tunneling-hysteretic resistor junction.

7. The method of claim 1 wherein the conductive elements are arranged along a first direction, and further wherein a longitudinal axis of each of the first nanowires is oriented at a non-zero angle relative to the first direction.

8. The method of claim 1, further comprising:
   prior to switching a portion of the switching junctions, determining a connectivity map for the first layer of nanowires and the conductive elements.

9. A nanowire structure including a mixed-scale interface, the nanowire structure comprising:
   a substrate including a number of microscale or submicroscale conductive elements electrically coupled to circuitry embedded within the substrate;
   a first layer of nanowires overlying a first number of the conductive elements, at least some of the nanowires overlying more than one of the conductive elements;
   a second layer of nanowires overlying the first layer of nanowires, the nanowires of the second layer of nanowires running perpendicular to the nanowires of the first layer of nanowires and in electrical communication with a second number of the conductive elements;
   at least a portion of the first and second number of conductive elements electrically coupled to more than one of the nanowires through individual switching junctions created between the first layer of nanowires and second layer of nanowires, a portion of the switching junctions configured in a high-conductance state and a portion of the switching junctions configured in a low-conductance state, individual nanowires of the first and second layer of nanowires electrically coupled to different conductive elements of the first and second number of microscale or submicroscale conductive elements using a different one of the switching junctions configured in the high-conductance state.

10. The nanowire structure of claim 9 wherein each of the switching junctions comprises a nonlinear-tunneling-hysteretic resistor junction.

* * * * *

UNITED STATES PATENT AND TRADEMARK OFFICE
CERTIFICATE OF CORRECTION

| | |
|---|---|
| PATENT NO. | : 8,773,882 B2 |
| APPLICATION NO. | : 12/761300 |
| DATED | : July 8, 2014 |
| INVENTOR(S) | : Zhiyong Li et al. |

It is certified that error appears in the above-identified patent and that said Letters Patent is hereby corrected as shown below:

IN THE CLAIMS:

In column 16, line 12, in Claim 9, delete "number" and insert -- numbers --, therefor.

In column 16, line 15, in Claim 9, delete "and" and insert -- and the --, therefor.

In column 16, line 20, in Claim 9, delete "layer" and insert -- layers --, therefor.

In column 16, line 22, in Claim 9, delete "number" and insert -- numbers --, therefor.

Signed and Sealed this
Twenty-first Day of April, 2015

Michelle K. Lee
*Director of the United States Patent and Trademark Office*